(12) United States Patent
Kim et al.

(10) Patent No.: US 10,886,361 B2
(45) Date of Patent: Jan. 5, 2021

(54) SEMICONDUCTOR DEVICES INCLUDING RESISTOR STRUCTURES

(71) Applicant: Samsung Electronics Co., Ltd., Suwon-si (KR)

(72) Inventors: Tae-yeol Kim, Hwaseong-si (KR); Hyon-wook Ra, Hwaseong-si (KR); Seo-bum Lee, Seoul (KR); Jun-soo Kim, Uijeongbu-si (KR); Chung-hwan Shin, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 436 days.

(21) Appl. No.: 15/862,774

(22) Filed: Jan. 5, 2018

(65) Prior Publication Data
US 2018/0374915 A1  Dec. 27, 2018

(30) Foreign Application Priority Data
Jun. 26, 2017  (KR) .................. 10-2017-0080734

(51) Int. Cl.
*H01L 49/02* (2006.01)
*H01L 27/06* (2006.01)
(Continued)

(52) U.S. Cl.
CPC ........ *H01L 28/20* (2013.01); *H01L 21/28518* (2013.01); *H01L 21/76804* (2013.01); *H01L 21/76805* (2013.01); *H01L 21/76816* (2013.01); *H01L 21/76834* (2013.01); *H01L 23/528* (2013.01); *H01L 23/5226* (2013.01); *H01L 23/5228* (2013.01); *H01L 27/0629* (2013.01); *H01L 27/0635* (2013.01); *H01L 29/785* (2013.01); *H01L 23/485* (2013.01); *H01L 23/5329* (2013.01); *H01L 23/53223* (2013.01);
(Continued)

(58) Field of Classification Search
CPC ......... H01L 21/76804; H01L 21/76816; H01L 23/5226; H01L 23/5228; H01L 23/528; H01L 27/0629; H01L 27/0635; H01L 28/20; H01L 23/647; H01C 1/14; H01C 1/146
See application file for complete search history.

(56) References Cited

U.S. PATENT DOCUMENTS

| 4,698,128 A | 10/1987 | Berglund et al. |
| 4,902,377 A | 2/1990 | Berglund et al. |

(Continued)

FOREIGN PATENT DOCUMENTS

KR  10-1138166  4/2012

*Primary Examiner* — Zandra V Smith
*Assistant Examiner* — Abbigale A Boyle
(74) *Attorney, Agent, or Firm* — Muir Patent Law, PLLC

(57) ABSTRACT

A semiconductor device is provided including a resistor structure, the semiconductor device including a substrate having an upper surface perpendicular to a first direction; a resistor structure including a first insulating layer on the substrate, a resistor layer on the first insulating layer, and a second insulating layer on the resistor layer; and a resistor contact penetrating the second insulating layer and the resistor layer. The tilt angle of a side wall of the resistor contact with respect to the first direction varies according to a height from the substrate. The semiconductor device has a low contact resistance and a narrow variation of contact resistance.

20 Claims, 17 Drawing Sheets

(51) Int. Cl.
*H01L 21/768* (2006.01)
*H01L 23/522* (2006.01)
*H01L 21/285* (2006.01)
*H01L 23/528* (2006.01)
*H01L 29/78* (2006.01)
*H01L 29/51* (2006.01)
*H01L 23/532* (2006.01)
*H01L 23/485* (2006.01)

(52) U.S. Cl.
CPC ........ *H01L 29/517* (2013.01); *H01L 29/7846* (2013.01)

(56) References Cited

U.S. PATENT DOCUMENTS

| | | | |
|---|---|---|---|
| 5,094,900 A | 3/1992 | Langley | |
| 5,652,170 A | 7/1997 | Keller et al. | |
| 5,843,845 A | 12/1998 | Chung | |
| 6,316,816 B1 | 11/2001 | Matsumoto | |
| 6,369,416 B1 | 4/2002 | Hui et al. | |
| 6,372,637 B2 | 4/2002 | Tang | |
| 6,815,825 B2 | 11/2004 | Tang | |
| 6,903,012 B2 | 6/2005 | Geefay et al. | |
| 7,282,802 B2 * | 10/2007 | Clevenger | H01L 21/76802 257/751 |
| 7,332,403 B1 | 2/2008 | Hill et al. | |
| 7,902,629 B2 * | 3/2011 | Chinthakindi | H01L 23/5228 257/211 |
| 8,477,006 B2 * | 7/2013 | Yang | H01L 28/20 257/258 |
| 8,766,405 B2 | 7/2014 | Kim | |
| 8,779,526 B2 * | 7/2014 | Hsu | H01L 27/0629 257/379 |
| 9,330,971 B2 | 5/2016 | Beasor et al. | |
| 9,406,770 B2 | 8/2016 | Song et al. | |
| 2001/0046771 A1 | 11/2001 | Steinmann et al. | |
| 2013/0277754 A1 * | 10/2013 | Liang | H01L 27/0629 257/379 |
| 2016/0218062 A1 | 7/2016 | Aggarwal et al. | |
| 2017/0069708 A1 | 3/2017 | Ali et al. | |

* cited by examiner

SEMICONDUCTOR DEVICES INCLUDING RESISTOR STRUCTURES

CLAIM OF PRIORITY

This application is related to and claims priority from Korean Patent Application No. 10-2017-0080734, filed on Jun. 26, 2017, in the Korean Intellectual Property Office, the disclosure of which is hereby incorporated herein by reference in its entirety.

FIELD

The present inventive concept relates generally to semiconductor devices and, more particularly, to semiconductor devices including resistor structures.

BACKGROUND

A resistor layer of a resistor device included in a semiconductor device may be connected to a metal interconnection through a contact. Therefore, the total resistance of the resistor device is the sum of the resistance of the resistor layer itself and the resistance of the contact. The resistor layer generally needs to be thinned for reduction in size of semiconductor devices. As the resistor layer becomes thinner, the contact area between the resistor layer and the contact decreases. As a result, the contact resistance increases and the variation in the contact resistance also increases. Therefore, there is a need to reduce the contact resistance of the resistor device and the variation of the contact resistance of the resistor device.

SUMMARY

Some embodiments of the present inventive concept include semiconductor devices having a resistor structure including a low contact resistance and a narrow variation of contact resistance.

In further embodiments, a semiconductor device includes a substrate having an upper surface perpendicular to a first direction; a resistor structure including a first insulating layer on the substrate, a resistor layer on the first insulating layer, and a second insulating layer on the resistor layer; and a resistor contact penetrating the second insulating layer and the resistor layer. The tilt angle of a side wall of the resistor contact with respect to the first direction varies according to a height from the substrate.

In still further embodiments of the inventive concept, a semiconductor device includes a substrate having an upper surface perpendicular to a first direction and having a transistor area and a resistor area; a lower structure on the resistor area and the transistor area; a resistor structure on a portion of the lower structure on the resistor area and including a first insulating layer, a resistor layer on the first insulating layer, and a second insulating layer located on the resistor layer; and a resistor contact penetrating the second insulating layer and the resistor layer. A tilt angle of a side wall of the resistor contact with respect to the first direction varies according to a height from the substrate.

In some embodiments of the inventive concept, a semiconductor device includes a substrate having an upper surface perpendicular to a first direction and having a transistor area and a resistor area; a lower structure on the transistor area and the resistor area, and including a plurality of gate structures, a lower interlayer insulating layer filling spaces in between the plurality of gate structures, an active region below the gate structures on the transistor area, and a source/drain region contacting the active region; a resistor structure on a portion of the lower structure on the resistor area and including a first insulating layer, a resistor layer on the first insulating layer, and a second insulating layer on the resistor layer; an upper interlayer insulating layer covering the resistor structure and the lower structure; a resistor contact penetrating the upper interlayer insulating layer, the second insulating layer, and the resistor layer; and a source/drain contact contacting the source/drain region through the upper interlayer insulating layer and the lower interlayer insulating layer, wherein a tilt angle of a side wall of the resistor contact with respect to the first direction varies according to a height from the substrate.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
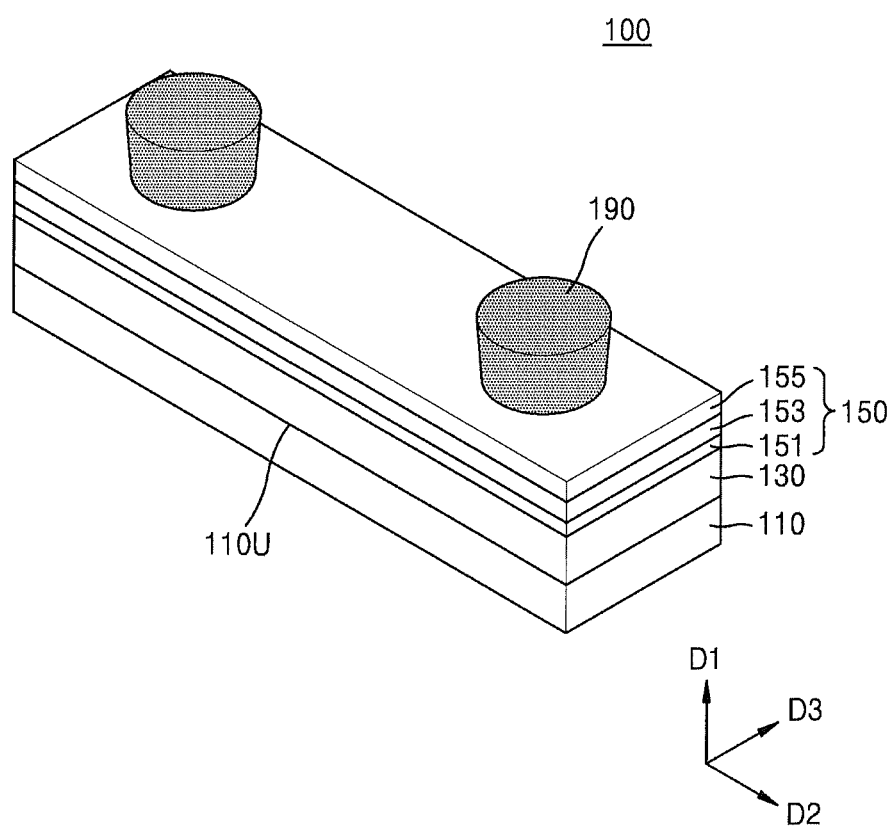
FIGS. 1, 2, and 3A are a perspective view, cross-sectional view, and plan view, respectively, of a semiconductor device according to some embodiments of the present inventive concept.

The inventive concept will now be discussed more fully hereinafter with reference to the accompanying drawings, in which exemplary embodiments of the inventive concept are shown. The inventive concept and methods of achieving the inventive concept will be apparent from the following exemplary embodiments that will be discussed in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. As used herein, the term "and/or" includes any and all combinations of some of the associated listed items. It will be understood that when an element is referred to as being "connected" or "coupled" to another element, it may be directly connected or coupled to the other element or intervening elements may be present. It will be further understood that the terms "comprises", "comprising,", "includes" and/or "including", when used herein, specify the presence of stated features, integers, steps, operations, elements, and/or components, but do not preclude the presence or addition of some other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the embodiments in the detailed description will be discussed with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes.

Exemplary embodiments of aspects of the present inventive concept explained and illustrated herein include their complementary counterparts. The same reference numerals or the same reference designators denote the same elements throughout the specification.

Figure 2:
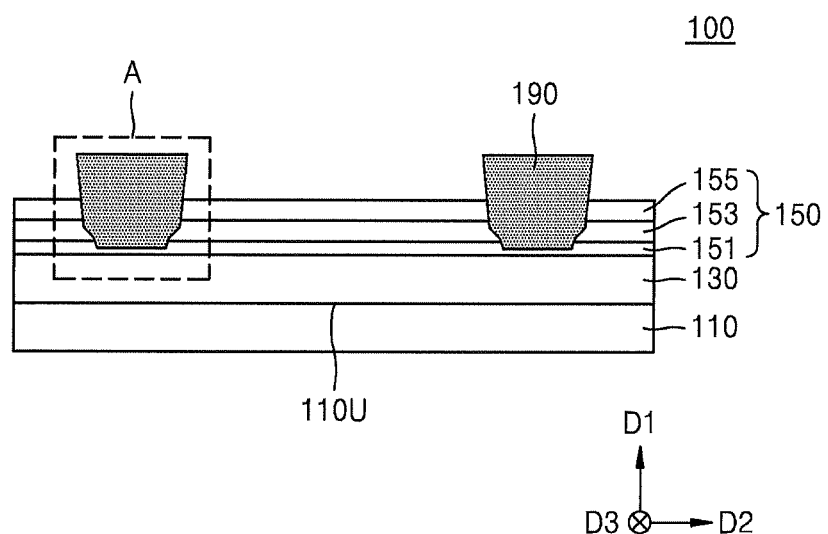
Figure 3A:
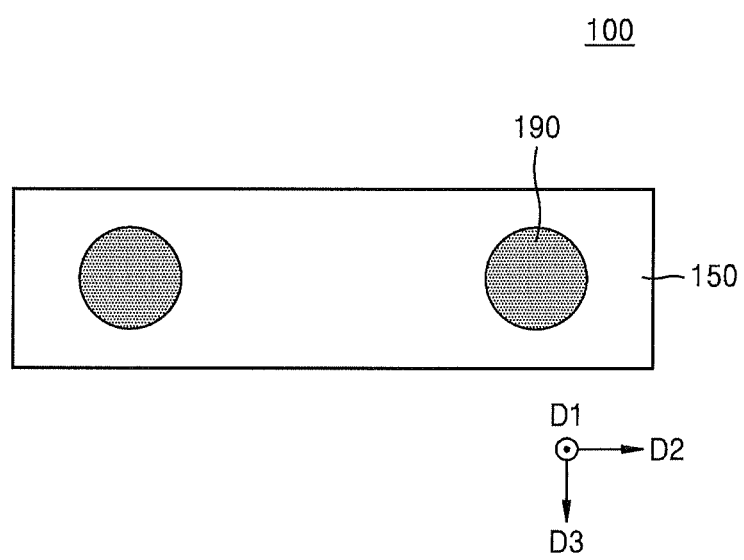

Referring now to FIGS. 1, 2, and 3A, a perspective view, a cross-sectional view, and a plan view, respectively, of a semiconductor device according to some embodiments of the present inventive concept. As illustrated in FIGS. 1, 2, and 3A, a semiconductor device 100 according to some embodiments of the present inventive concept includes a substrate 110, a lower structure 130 located on the substrate 110, a resistor structure 150 located on the lower structure 130, and a resistor contact 190 in contact with the resistor structure 150. In some embodiments, the semiconductor device 100 may not include the lower structure 130 as illustrated, and the resistor structure 150 may be located directly on the substrate 110 without departing from the scope of the present inventive concept.

The substrate 110 may have an upper surface 110U that is perpendicular to a first direction D1 and extends in a second direction D2 and a third direction D3. Hereinafter, a height from the substrate 110 means a distance from the upper surface 110U of the substrate 110 in the first direction D1. The first direction D1, the second direction D2, and the third direction D3 may be perpendicular to each other. The substrate 110 may include a semiconductor material such as a Group IV semiconductor material, a Group III-V semiconductor material, or a Group II-VI semiconductor material. The Group IV semiconductor material may include, for example, silicon (Si), germanium (Ge), or silicon (Si)-germanium (Ge). The Group III-V semiconductor material includes, for example, gallium arsenide (GaAs), indium phosphide (InP), gallium phosphide (GaP), indium arsenide (InAs), indium antimony (InSb), or indium gallium arsenide (InGaAs). The Group II-VI semiconductor material may include, for example, zinc telluride (ZnTe), or cadmium sulfide (CdS). In some embodiments, the substrate 110 may be a bulk wafer or an epitaxial layer.

The lower structure 130 may be located on the substrate 110. The lower structure 130 may have various structures. For example, the lower structure 130 may include only a single layer or a single pattern. In some embodiments, the lower structure 130 may include a complex structure including a combination of a plurality of layers and a plurality of patterns.

The resistor structure 150 may be located on the lower structure 130. The width of the resistor structure 150 in the second direction D2 and the width of the resistor structure 150 in the third direction D3 may each be determined according to a target resistance value. The cross-section of the resistor structure 150, perpendicular to the first direction D1 in FIG. 3A, has a rectangular shape. However, the shape and width of the cross-section of the resistor structure 150 may be variously modified according to the device design.

The resistor structure 150 may include a first insulating layer 151 located on the lower structure 130, a resistor layer 153 located on the first insulating layer 151, and a second insulating layer 155 located on the resistor layer 153. In some embodiments, the first insulating layer 151, the resistor layer 153, and the second insulating layer 155 may have a substantially similar planar area.

The first insulating layer 151 may include, for example, an oxide, such as aluminum oxide ($Al_2O_3$) or silicon oxide ($SiO_2$). In some embodiments, the first insulating layer 151 may have a thickness of about 10 Å to about 100 Å. The resistor layer 153 may include a metal-based material such as a metal, a conductive metal nitride, or a metal silicide. For example, the resistor layer 153 may include titanium (Ti), titanium nitride (TiN), tantalum (Ta), tantalum nitride (TaN), tungsten (W), or tungsten silicide (WSi). The resistor layer 153 may have a thickness of about 10 Å to about 100 Å. The second insulating layer 155 may include, for example, silicon nitride (SiN). In some embodiments, the second insulating layer 155 may have a thickness of about 10 Å to about 100 Å.

Unlike the embodiments illustrated in FIGS. 1 and 2, in some embodiments, the resistor structure 150 may be located on the substrate 110. In other words, a semiconductor device according to some embodiments may not include the lower structure 130. Unlike the embodiments illustrated in FIGS. 1 and 2, in some embodiments, the resistor structure 150 may further include a third insulating layer 157 (see FIG. 6B) located on the second insulating layer 155. The third insulating layer 157 (see FIG. 6B) may include an oxide, such as aluminum oxide ($Al_2O_3$), or silicon oxide ($SiO_2$). In some embodiments, the third insulating layer 157 may have a thickness of about 10 Å to about 100 Å.

Referring to FIG. 2, the resistor contact 190 penetrates the second insulating layer 155 and the resistor layer 153 of the resistor structure 150, and a bottom surface of the resistor contact 190 may contact the first insulating layer 151. The resistor contact 190 may include a resistor contact core layer and a resistor contact barrier layer surrounding the side walls and bottom of the resistor contact core layer.

The resistor contact core layer may include a metal, a metal nitride, or an alloy. Examples of the metal are tungsten (W), copper (Cu), titanium (Ti), tantalum (Ta), ruthenium (Ru), manganese (Mn), and cobalt (Co). The metal nitride may include, for example, titanium nitride (TiN), tantalum nitride (TaN), cobalt nitride (CoN), or tungsten nitride (WN). The alloy may include cobalt tungsten phosphorus (CoWP), cobalt tungsten boron (CoWB), or cobalt tungsten boron phosphorous (CoWBP). The resistor contact barrier layer may include, for example, titanium (Ti), tantalum (Ta), titanium nitride (TiN), or tantalum nitride (TaN).

Unlike the embodiments illustrated in FIGS. 1 and 2, in some embodiments, the resistor contact 190 may contact the lower structure 130 through the first insulating layer 151. In some embodiments to be explained in connection with FIG. 6B in which the third insulating layer 157 (see FIG. 6B) is further placed on the second insulating layer 155, the resistor contact 190 may penetrate the third insulating layer 157 (see FIG. 6B), the second insulating layer 155, and the resistor layer 153 of the resistor structure 150.

A semiconductor device according to some embodiments may include a plurality of resistor contacts, each being the resistor contact 190. Although FIGS. 1, 2, and 3A illustrate two resistor contacts arranged in the second direction D2, the number and arrangement of the resistor contacts may vary according to design.

Figure 3B:
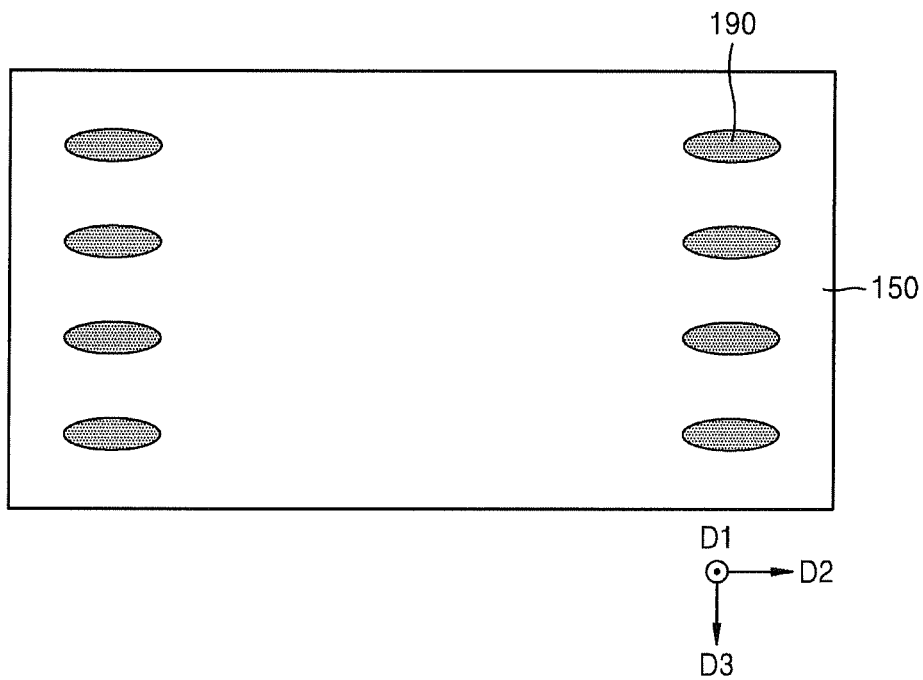
FIGS. 3B and 3C are plan views of semiconductor devices according to some embodiments of the present inventive concept.
Figure 3C:
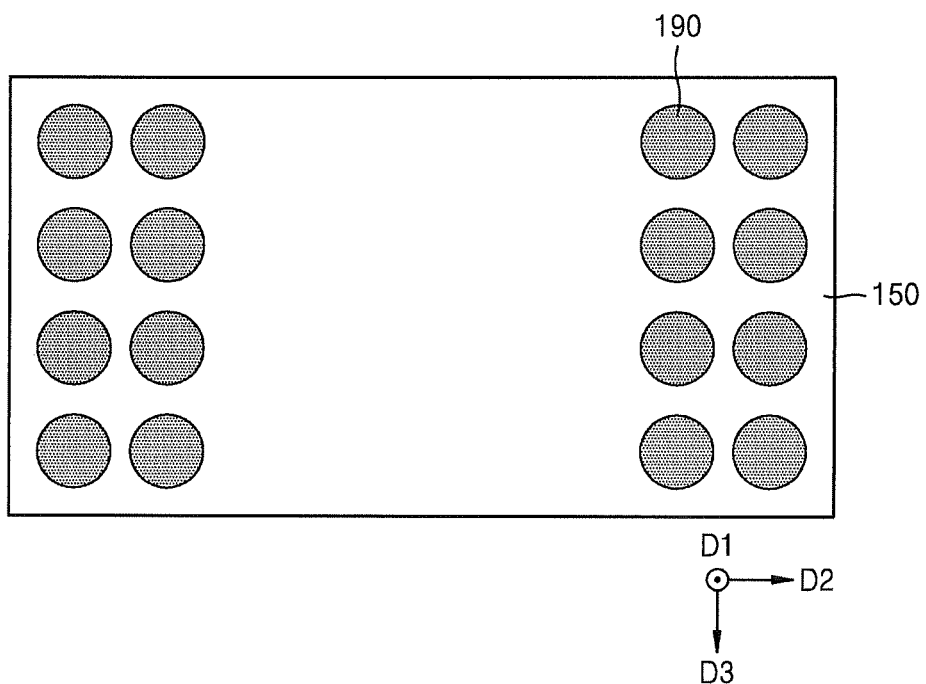

FIGS. 3B and 3C are plan views of semiconductor devices 100 according to some embodiments of the present inventive concept. Referring to FIGS. 3B and 3C, the shape of the cross-section of the resistor contact 190 may vary. For example, the cross-section of the resistor contact 190 may be circular as illustrated in FIG. 3C or oval as illustrated in FIG. 3B. In some embodiments, the arrangement of resistor contacts, each being the resistor contact 190, may be variously modified. For example, as illustrated in FIG. 3B, resistor contacts may be arranged line by line along two facing edges of the resistor structure 150 in the third direction D3. For example, as illustrated in FIG. 3C, resistor contacts may be arranged in two lines along each of two facing edges of the resistor structure 150 in the third direction D3.

Figure 4A:
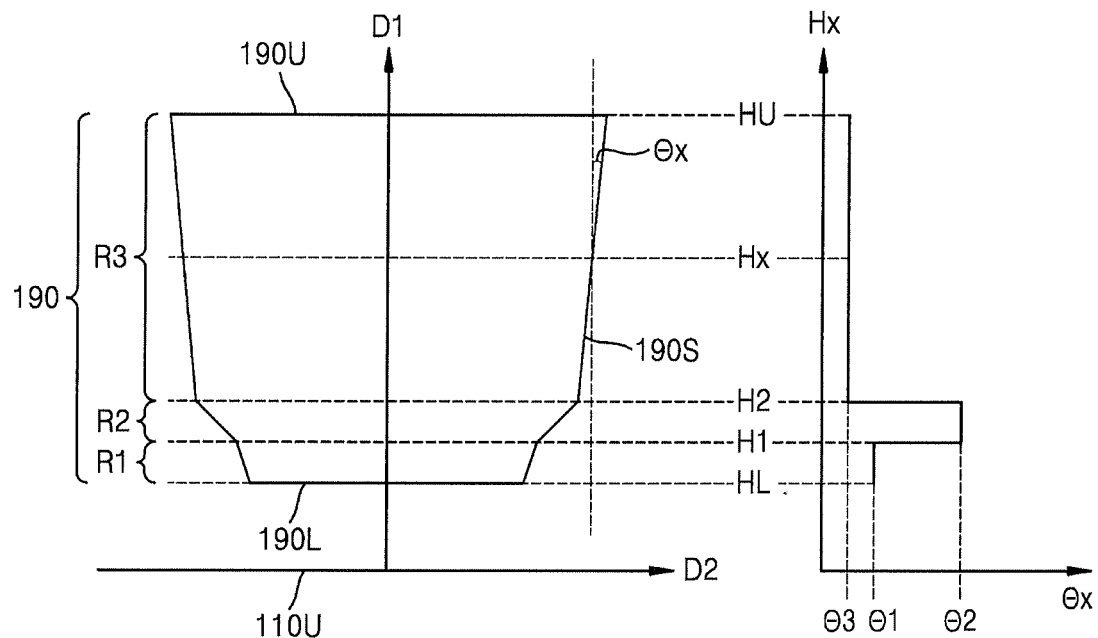
FIGS. 4A, 4B, and 4C are enlarged cross-sections of a resistor contact included in a semiconductor device according to some embodiments of the present inventive concept.
Figure 4B:
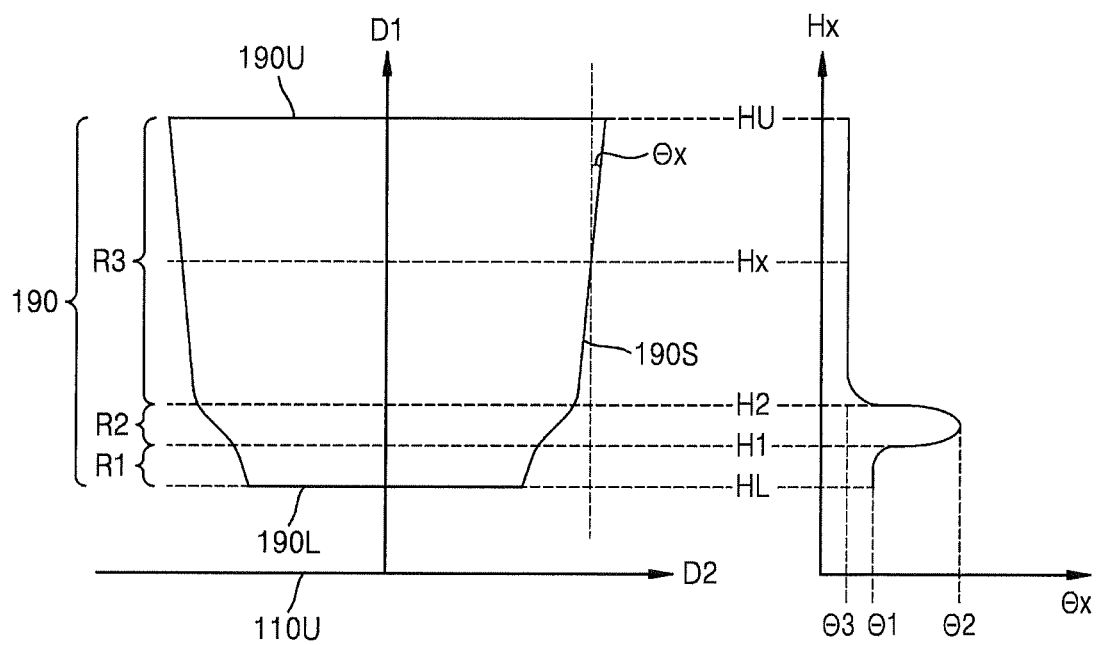
Figure 4C:
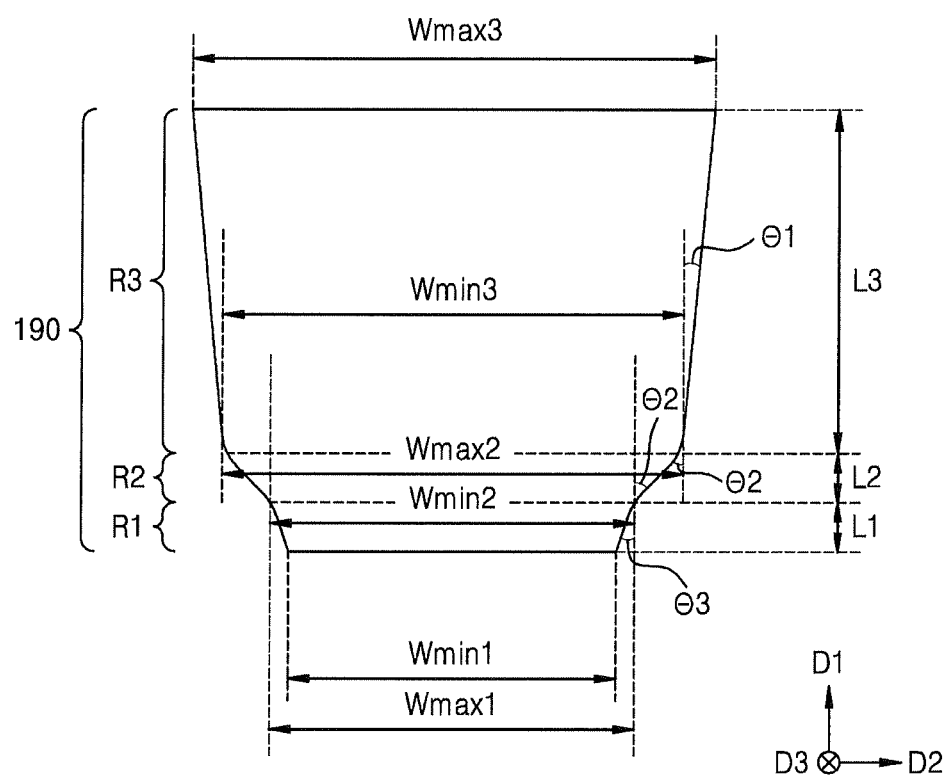

FIGS. 4A, 4B, and 4C are enlarged cross sections of various modifications of the resistor contact 190 included in a semiconductor device according to some embodiments of the present inventive concept. Referring to FIG. 4A, a tilt angle θx of a side wall 190S of the resistor contact 190 with respect to the first direction D1 perpendicular to the upper surface 110U of the substrate 110 may vary depending on a height Hx from the upper surface 110U of the substrate 110. For example, the tilt angle θx may change at a first height H1 from the upper surface 110U of the substrate 110 and a second height H2 being greater than the first height H1. In some embodiments, the tilt angle θx corresponding to a portion between a lower end height HL of a lower end 190L of the resistor contact 190 and the first height H1 of the resistor contact 190 is a first tilt angle θ1, the tilt angle θx corresponding to a portion between the first height H1 and the second height H2 is a second tilt angle θ2, and the tilt angle θx corresponding to a portion between the second height H2 and an upper end height HU of an upper end 190U of the resistor contact 190 is a third tilt angle θ3. That is, the resistor contact 190 may include a first region R1 having the first tilt angle θ1, a second region R2 located on the first region R1 and having the second tilt angle θ2, and a third region R3 located on the second region R2 and having the third tilt angle θ3.

In some embodiments, the first tilt angle θ1 may be less than the second tilt angle θ2, and the second tilt angle θ2 may be greater than the third tilt angle θ3. The first tilt angle θ1 and the third tilt angle θ3 may each be, for example, equal to or greater than about 0 degrees and less than or equal to about 20 degrees or less. In some embodiments, the first tilt angle θ1 and the third tilt angle θ3 are sufficiently small such that the side wall 190S of the resistor contact 190 in the first region R1 and the third region R3 may be substantially parallel to the first direction D1. In some embodiments, the second tilt angle θ2 may be equal to or greater than about 20 degrees and less than or equal to about 70 degrees. The side wall 190S of the resistor contact 190 in the second region R2 may not be substantially parallel to the first direction D1.

Referring to 4B and 4C, unlike the embodiments discussed above with respect to FIG. 4A, in some embodiments, at the boundary between the first region R1 and the second region R2 and the boundary between the second region R2 and the third region R3, the side wall 190S of the resistor contact 190 may have a round corner, rather than a sharp corner. In other words, the tilt angle θx of the side wall 190S of the resistor contact 190 with respect to the first direction D1 may be continuously changed depending on the height Hx from the substrate 110. In this regard, the maximum points of the magnitude of the change rate $d(\theta x)/d(Hx)$ of the tilt angle with respect to the height from the substrate 110 may be defined as the first height H1 and the second height H2. In other words, when the tilt angle θx of the side wall 190S of the resistor contact 190 with respect to the first direction D1 is expressed as a function of the height Hx from the substrate 110, the second derivative of the tilt angle $d^2(\theta x)/d(Hx)^2$ at the first height H1 and the second height H2 may be 0. The following equations may be satisfied at the first height H1 and the second height H2.

$$\left.\frac{d^2\theta x}{d(Hx)^2}\right|_{Hx=H1} = 0 \qquad \text{Eqn. (1)}$$

$$\left.\frac{d^2\theta x}{d(Hx)^2}\right|_{Hx=H2} = 0 \qquad \text{Eqn. (2)}$$

In this regard, a region from the lower end height HL of the resistor contact 190 to the first height H1 may be defined as the first region R1, a region from the first height H1 to the second height H2 may be defined as the second region R2, and a region from the second height H2 to the upper end height HU may be defined as the third region R3. The first tilt angle θ1, which is the tilt angle of the first region R1, may be defined as an average value of tilt angles θx of the side wall 190S of the resistor contact 190 in the range from the lower end height HL to the first height H1 of the resistor contact 190. Similarly, the second tilt angle θ2, which is the tilt angle of the second region R2, may be defined as an average value of tilt angles θx of the side wall 190S of the resistor contact 190 in the range from the first height H1 to the second height H2. Similarly, the third tilt angle θ3, which is the tilt angle of the third region R3, may also be defined as an average value of the tilt angle θx of the side wall 190S of the resistor contact 190 in the range from the second height H2 to the upper end height HU. That is, the first tilt angle θ1, the second tilt angle θ2, and the third tilt angle θ3 may satisfy the following equations.

$$\theta 1 = \frac{1}{H1-HL}\int_{HL}^{H1}(\theta x)d(Hx) \qquad \text{Eqn. (3)}$$

$$\theta 2 = \frac{1}{H2-H1}\int_{H1}^{H2}(\theta x)d(Hx) \qquad \text{Eqn. (4)}$$

$$\theta 3 = \frac{1}{HU - H2} \int_{H2}^{HU} (\theta x) d(Hx) \qquad \text{Eqn. (5)}$$

Therefore, even in embodiments where the side wall 190S of the resistor contact 190 has a round corner at the boundary between the first region R1 and the second region R2 and at the boundary between the second region R2 and the third region R3, the resistor contact 190 may include the first region R1 having the first tilt angle θ1, the second region R2 located on the first region R1 and having the second tilt angle θ2, and the third region R3 located on the second region R2 and having the third tilt angle θ3. In these embodiments, the first tilt angle θ1 may be less than the second tilt angle θ2, and the second tilt angle θ2 may be greater than the third tilt angle θ3.

Referring to FIG. 4C, a length L1 of the first region R1 in the first direction D1 may be less than a length L3 of the third region R3 in the first direction D1. A length L2 of the second region R2 in the first direction D1 may be less than the length L3 of the third region R3 in the first direction D1.

In some embodiments, a maximum width Wmax1 of the first region R1 in the second direction D2 may be in a range of, for example, from about 10 nm to about 100 nm. In some embodiments, the maximum width Wmax1 of the first region R1 in the second direction D2 perpendicular to the first direction D1 may be less than a maximum width Wmax3 of the third region R3 in the second direction D2. The difference between the maximum width Wmax1 of the first region R1 in the second direction D2 and a minimum width Wmin1 of the first region R1 in the second direction D2 may be less than the difference between a maximum width Wmax2 of the second region R2 in the second direction D2 and a minimum width Wmin2 of the second region R2 in the second direction D2. The difference between the maximum width Wmax2 of the second region R2 in the second direction D2 and the minimum width Wmin2 of the second region R2 in the second direction D2 may be greater than the difference between the maximum width Wmax3 of the third region R3 in the second direction D2 and a minimum width Wmin3 of the third region R3 in the second direction D2.

FIGS. 5A, 5B, 5C, and 5D are enlarged views to explain various modifications of the area A in FIG. 2. Referring to FIGS. 5A to 5D, the first region R1 may contact the first insulating layer 151. The second region R2 may contact the resistor layer 153. The third region R3 may contact the second insulating layer 155. A contact surface between the second region R2 and the resistor layer 153 may not be parallel to the first direction D1. That is, a contact surface between the second region R2 and the resistor layer 153 may have the second tilt angle θ2, not 0 degrees, with respect to the first direction D1. In this case, the contact surface between the second region R2 and the resistor layer 153 increases as compared with the case where the contact surface is parallel to the first direction D1. Therefore, by obtaining a sufficient contact area between the resistor contact 190 and the resistor layer 153, the contact resistance and the variation in the contact resistance may be reduced.

For example, when the contact surface between the second region R2 and the resistor layer 153 is parallel to the first direction D1, the width of the second region R2 in the second direction D2 is maintained at about 66 nm, and a length L2 of the second region R2 in the first direction D1 is about 4.5 nm, the contact area between the resistor contact 190 and the resistor layer 153 is about 932.6 nm². According to some embodiments of the present inventive concept, when the length L2 of the second region R2 in the first direction D1 is about 4.5 nm, the width of the second region R2 corresponding to the first height H1 in the second direction D2 is about 66 nm, and the width of the second region R2 corresponding to the second height H2 in the second direction D2 is approximately 76 nm, the contact area between the resistor contact 190 and the resistor layer 153 is about 1003.2 nm². Therefore, the contact area between the second region R2 and the resistor layer 153 is increased by about 7.6%. In some embodiments, the contact area between the resistor contact 190 and the resistor layer 153 may be increased by about 5% to about 15%, as compared to when the contact surface between the second region R2 and the resistor layer 153 is perpendicular to the first direction D1.

In addition, when the tilt angle of the side wall of the resistor contact 190 varies according to the height, a maximum width of the resistor contact 190 in the second direction D2 to obtain the same contact area may be less than when the tilt angle is constant regardless of the height. For example, by increasing the second tilt angle θ2 to secure the contact area between the resistor contact 190 and the resistor layer 153 and reducing the third tilt angle θ3, the maximum width of the resistor contact 190 in the second direction D2 may be reduced. Therefore, by changing the tilt angle of the resistor contact 190 according to the height, a sufficient contact area may be obtained without an excess increase in the size of the resistor contact 190.

Figure 5A:
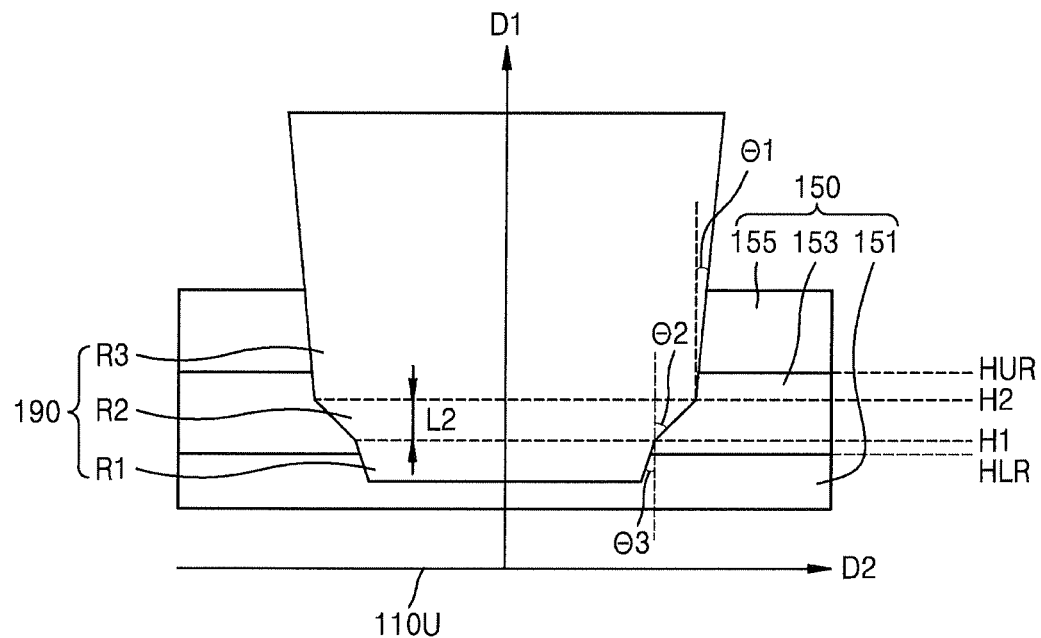
FIGS. 5A, 5B, 5C, and 5D are enlarged views illustrating various modifications of the area A in FIG. 2 in accordance with some embodiments of the present inventive concept.
Figure 5B:
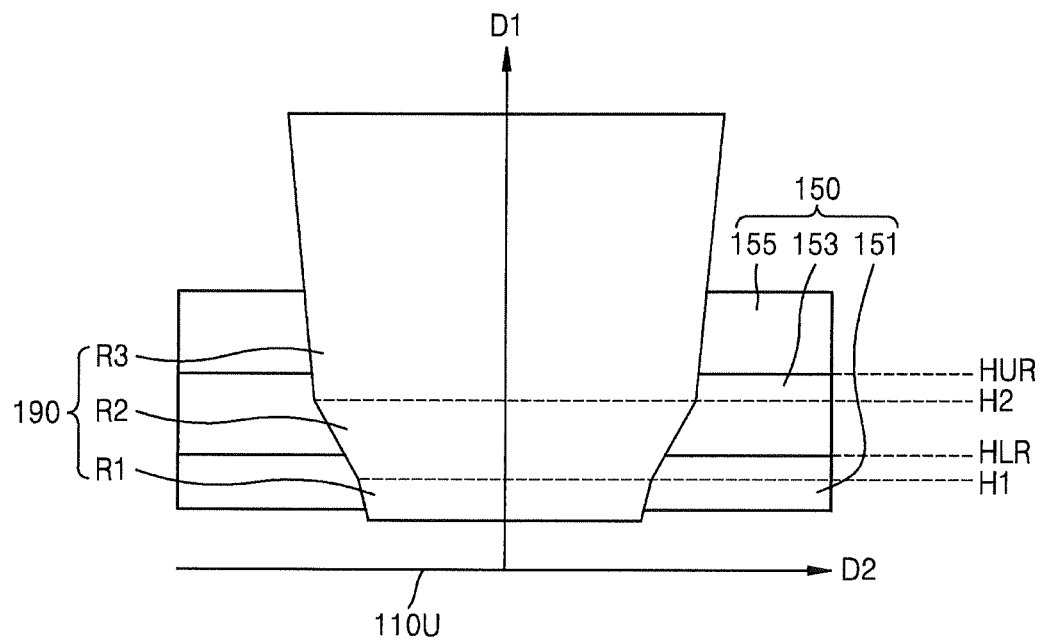
Figure 5C:
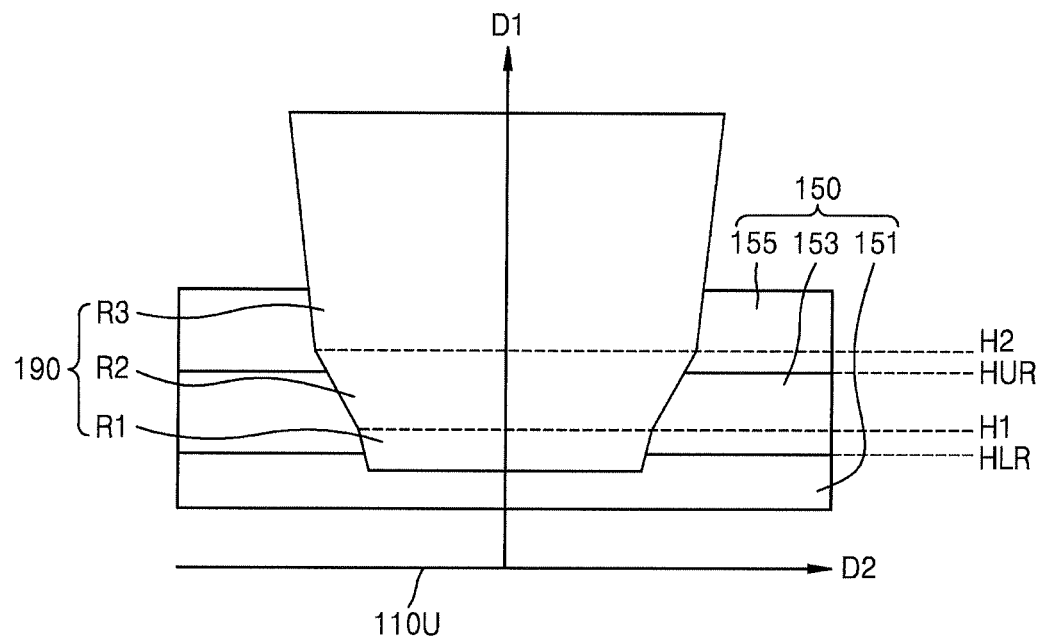
Figure 5D:
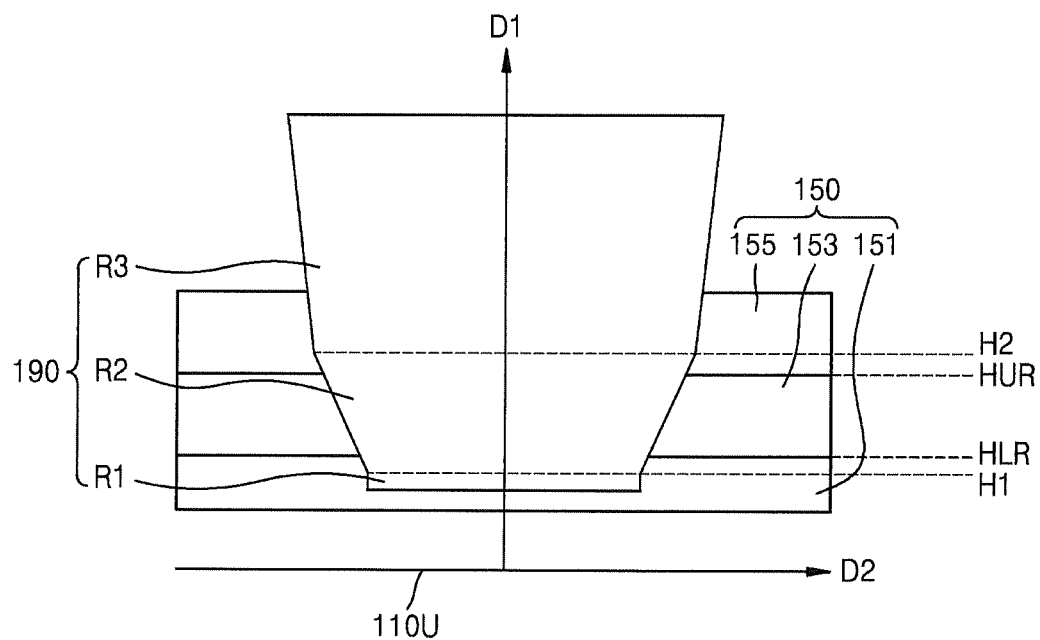

In terms of the height from the upper surface 110U of the substrate, the first height H1 may be less than a height HUR of an upper surface of the resistor layer 153 from the upper surface 110U of the substrate, and the second height H2 may be greater than the height HLR of a lower surface of the resistor layer 153 from the upper surface 110U of the substrate. In some embodiments, as illustrated in FIG. 5A, the first height H1 may be between the height HUR of the upper surface of the resistor layer 153 and a height HLR of the lower surface of the resistor layer 153, and the second height H2 may be between the height HUR of the upper surface of the resistor layer 153 and the height HLR of the lower surface of the resistor layer 153. In some embodiments, as illustrated in FIG. 5B, the first height H1 may be less than the height HLR of the lower surface of the resistor layer 153, and the second height H2 may be between the height HUR of the upper surface of the resistor layer 153 and the height HLR of the lower surface of the resistor layer 153. In some embodiments, as illustrated in FIG. 5C, the first height H1 may be between the height HLR of the lower surface of the resistor layer 153 and the height HUR of the upper surface of the resistor layer 153, and the second height H2 may be greater than the height HUR of the upper surface of the resistor layer 153. In some embodiments, as illustrated in FIG. 5D, the first height H1 may be less than the height HLR of the lower surface of the resistor layer 153 and the second height H2 may be greater than the height HUR of the upper surface of the resistor layer 153. That is, at least a portion of the side wall of the second region R2 may contact the resistor layer 153.

Figure 6A:
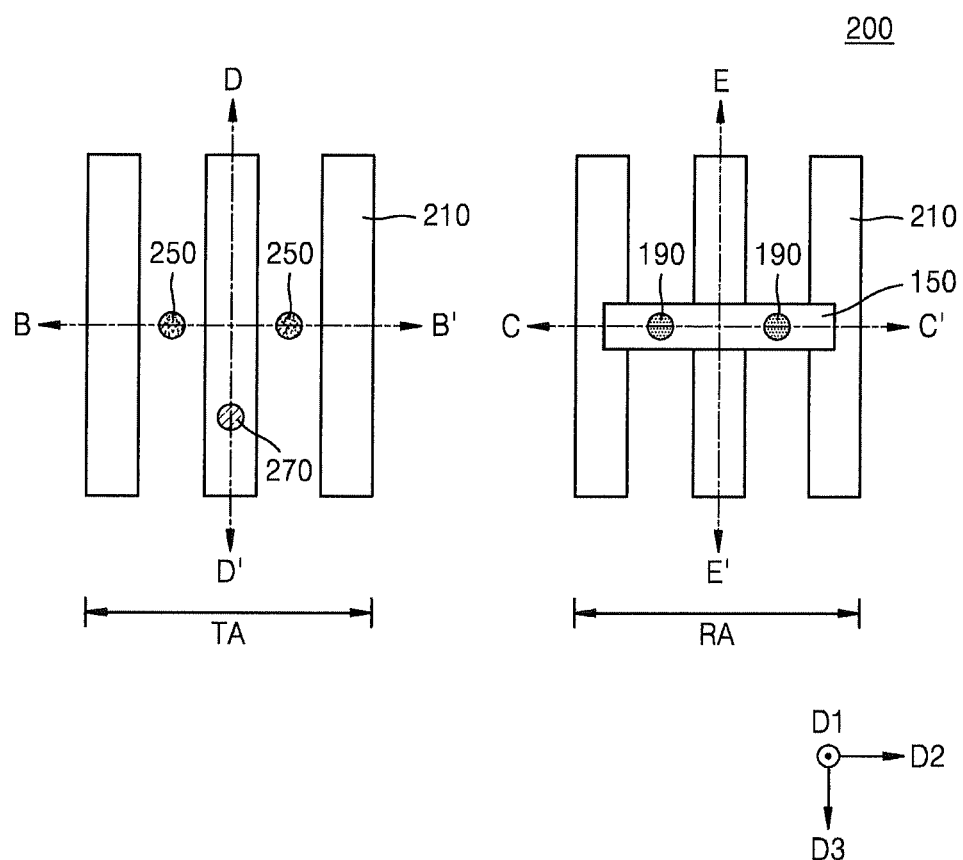
FIG. 6A is a plan view of a semiconductor device according to some embodiments of the present inventive concept.
Figure 6B:
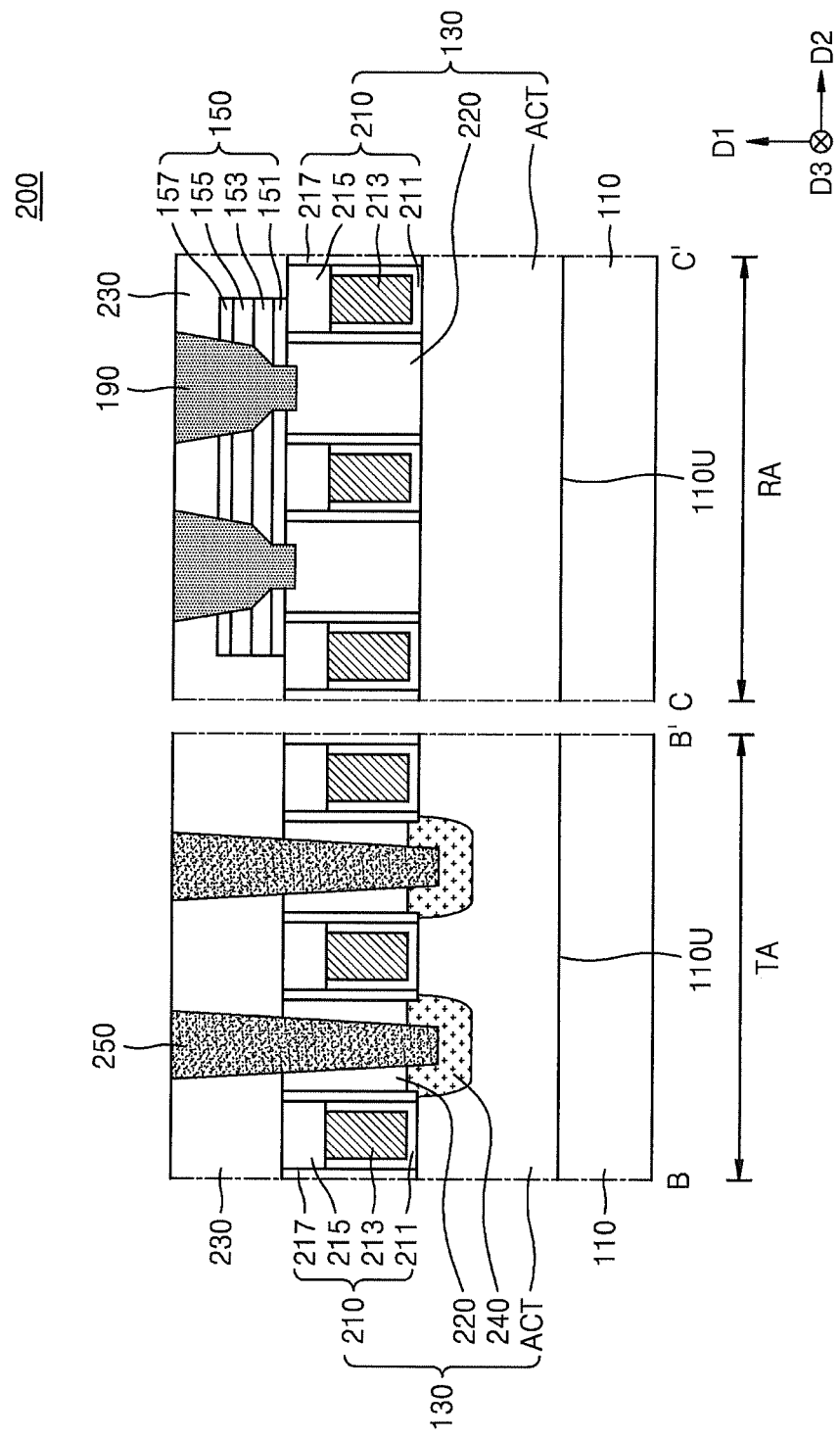
FIG. 6B is a cross-section taken along line BB' and line CC' illustrated in FIG. 6A in accordance with some embodiments of the present inventive concept.
Figure 6C:
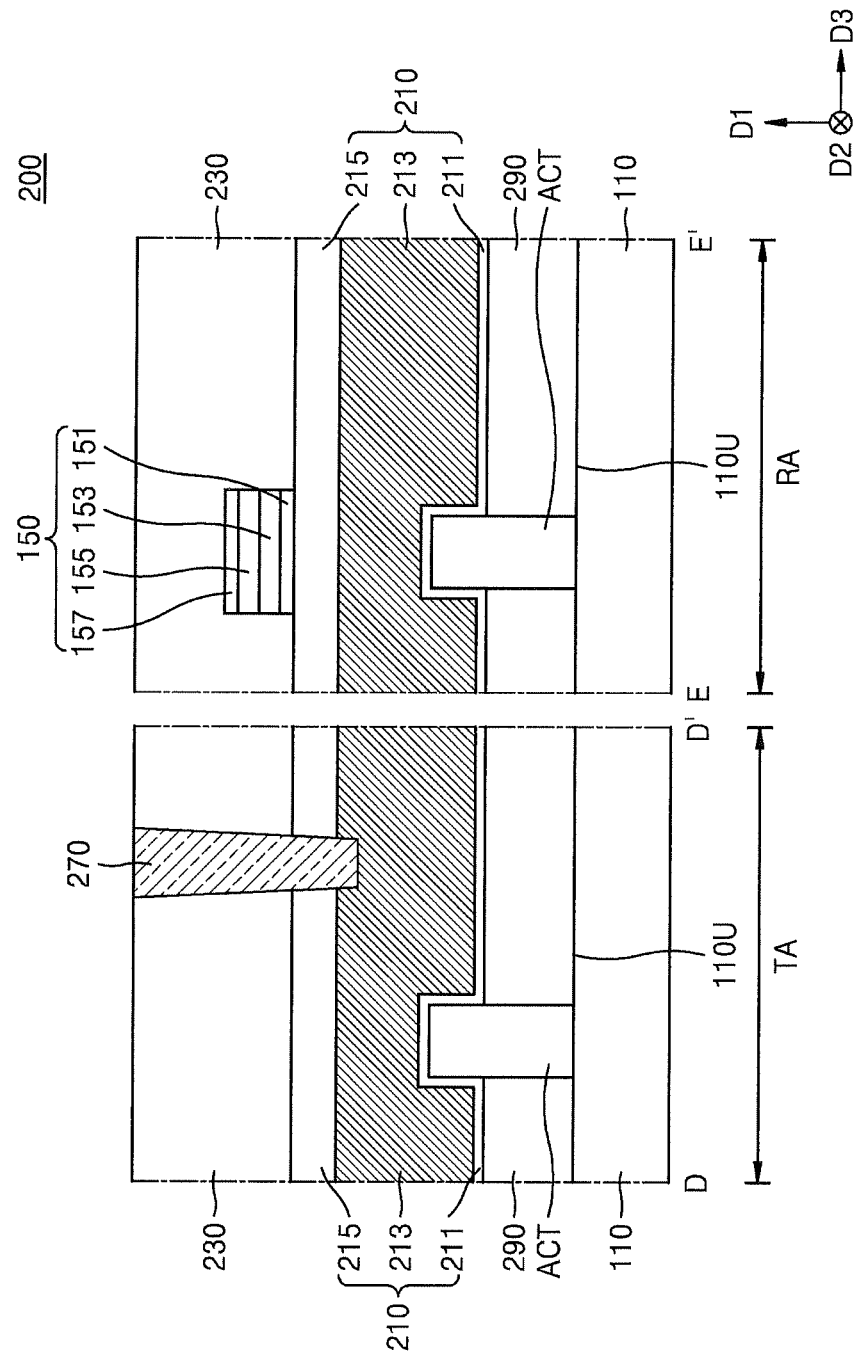
FIG. 6C is a cross-section taken along line DD' and line EE' illustrated in FIG. 6A in accordance with some embodiments of the present inventive concept.

FIG. 6A is a plan view of a semiconductor device 200 according to some embodiments of the present inventive concept. FIG. 6B is a cross section taken along line BB' and line CC' illustrated in FIG. 6A. FIG. 6C is a cross section taken along line DD' and line EE' illustrated in FIG. 6A. Referring to FIGS. 6A to 6C, the semiconductor device 200 according to some embodiments may include the substrate 110. The substrate 110 may have the upper surface 110U perpendicular to the first direction D1. In addition, the substrate 110 may include a transistor area TA and a resistor area RA.

The lower structure 130 may be located on the transistor area TA and the resistor area RA. The lower structure 130 may include an active region ACT, a device isolation layer 290, a source/drain region 240, a gate structure 210, and a lower interlayer insulating layer 220. A portion of the lower structure 130 located on the transistor area TA may include the active region ACT, the device isolation layer 290, the source/drain region 240, the gate structure 210, and the lower interlayer insulating layer 220. The active region ACT, the source/drain region 240, and the gate structure 210 which are located on the transistor area TA may constitute a transistor structure. A portion of the lower structure 130 located on the resistor area RA may not include at least one selected from the active region ACT, the device isolation layer 290, the gate structure 210, the source/drain region 240, and the lower interlayer insulating layer 220.

The active region ACT may be located on the transistor area TA and the resistor area RA. The active region ACT may be located below the gate structure 210. In some embodiments, unlike the embodiments explained in connection with FIGS. 6B and 6C, the active region ACT may be located only on the transistor area TA. That is, the active region ACT may be located only below the gate structure 210 located on the transistor area TA. In some embodiments, the active region ACT may be located inside the substrate 110. In some embodiments, as illustrated in FIG. 6B, the active region ACT may be in the form of a pin protruding from the upper surface 110U of the substrate 110 in the first direction D1. The active region ACT in the form of the pin may be formed by etching the substrate 110 or may be an epitaxial layer grown from the substrate 110. The active region ACT in the form of the pin may extend in the second direction D2. In some embodiments, the lower structure 130 may include a plurality of active areas ACT.

The device isolation layer 290 may be located on each of facing side walls of the active region ACT. The device isolation layer 290 may be formed to have such a height that a top portion of the pinned active region ACT is exposed. The device isolation layer 290 may include, for example, silicon oxide, silicon nitride, silicon oxynitride, or a combination thereof. A low-k material may include, for example, boron phospho-silicate glass (BPSG), tonen silazene (TOSZ), undoped silicate glass (USG), spin on glass (SOG), flowable oxide (FOX), tetra ethyl ortho silicate (TEOS), or high density plasma-chemical vapor deposition (HDP-CVD) oxide. In some embodiments, the device isolation layer 290 may include a plurality of layers. For example, the device isolation layer 290 may include a stressor liner and a burying insulating film.

The source/drain region 240 may be in contact with the active region ACT. The source/drain regions 240 may be located under the side walls of the gate structure 210. As illustrated in FIG. 6B, the source/drain region 240 may be located only on the transistor area TA. In some embodiments, unlike FIGS. 6A through 6C, the source/drain region 240 may be located on the transistor area TA and the resistor area RA. The source/drain regions 240 may include N-type or P-type impurities. The N-type impurity may include phosphorus (P) or arsenic (As). The P-type impurity may include boron (B). The source/drain region 240 may include a semiconductor layer that has been epitaxially grown from the active region ACT. For example, the source/drain region 240 may include an epitaxially grown silicon germanium (SiGe) layer, an epitaxially grown silicon (Si) layer, or an epitaxially grown silicon carbide (SiC) layer. In some embodiments, the source/drain regions 240 may include multiple epitaxial semiconductor layers. For example, the source/drain region 240 may include a silicon germanium (SiGe) layer containing a low concentration of germanium (Ge), a silicon germanium (SiGe) layer containing a high concentration of germanium (Ge), and a silicon (Si) layer. Unlike the embodiments explained in connection with FIGS. 6A to 6C, in some embodiments, the source/drain region 240 may be located inside the substrate 110.

In some embodiments, the gate structure 210 may extend in the third direction D3 perpendicular to the second direction D2 in which the active region ACT extends. Unlike the embodiments explained in connection with FIGS. 6A to 6C, in some embodiments, the gate structure 210 may be located only on the transistor area TA, not on the resistor area RA. In some embodiments, the gate structure 210 may be located on the resistor area RA and the transistor area TA. In some embodiments, the gate structure 210 may be located on the active region ACT. In some embodiments, the lower structure 130 may include a plurality of gate structures, each being the gate structure 210. The gate structure 210 located on the resistor area RA may be a dummy gate structure that does not constitute a transistor. In some embodiments, the gate structure 210 located on the resistor area RA may extend over the transistor area TA to constitute a transistor.

The gate structure 210 may include a gate dielectric layer 211, a gate electrode 213, a gate capping layer 215, and a gate spacer 217. The gate electrode 213 may extend in the third direction D3 on the active region ACT. The gate dielectric layer 211 may be located between the active region ACT and the gate electrode 213 and on facing side surfaces of the gate electrode 213. The gate capping layer 215 may be located on the gate electrode 213. The gate capping layer 215 may cover both the gate dielectric layer 211 and the gate electrode 213. The gate spacer 217 may be located on the gate dielectric layer 211 on each of the facing side walls of the gate electrode 213. The gate spacer 217 may cover a side wall of the gate capping layer 215. An upper end of the gate spacer 217 may lie at a higher level than an upper end of the gate dielectric layer 211 and an upper end of the gate electrode 213.

The gate dielectric layer 211 may include silicon oxide, silicon nitride, silicon oxynitride, gallium oxide, germanium oxide, high-k dielectric, or a combination thereof. In some embodiments, the gate dielectric layer 211 may include an interface film and a high-k film located on the interface film. The interface film may be located between the active region ACT and a lower surface of the gate electrode 213, and the high-k film may be located on the lower surface and facing side walls of the gate electrode 213. That is, between the side wall of the gate electrode 213 and the gate spacer 217, located is only the high-k film, not the interface film.

The interface film may include a low-k material having a relative dielectric constant of about 9 or less, for example, silicon oxide, silicon nitride, silicon oxynitride, gallium oxide, or germanium oxide, but a material for the interface film is not limited thereto. The interface film may include an oxide, nitride, or oxynitride of a material that constitutes the substrate 110. In one embodiment, the interface film may have a thickness of about 5 Å to about 20 Å, but the thickness thereof is not limited thereto. The interface film may be formed by thermal oxidation, atomic layer deposition (ALD), chemical vapor deposition (CVD), or physical vapor deposition (PVD).

The high-k film may include a high-k material of which a relative dielectric constant is greater than that of the interface film. For example, the relative dielectric constant of the high-k material may be in the range of about 10 to about 25. The high-k film may be formed of, for example, a hafnium-based material or a zirconium-based material. For example, the high-k film may include at least one selected from hafnium oxide (HfO$_2$), hafnium silicon oxide (HfSiO), hafnium silicon oxynitride (HfSiON), hafnium oxynitride (HfON), hafnium aluminum oxide (HfAlO), hafnium lanthanum oxide (HfLaO), zirconium oxide (ZrO$_2$), zirconium silicon oxide (ZrSiO), or the like. In addition, the material for forming the high-k film is not limited to the hafnium-based material or the zirconium-based material. For example, the high-k film may include other materials, for example, lanthanum oxide (La$_2$O$_3$), lanthanum aluminum oxide (LaAlO$_3$), tantalum oxide (Ta$_2$O$_5$), titanium oxide (TiO$_2$), strontium titanium oxide (SrTiO$_3$), yttrium oxide (Y$_2$O$_3$), or aluminum oxide (Al$_2$O$_3$). However, the material constituting the high-k film is not limited to these materials. The high-k film may be formed by an ALD process, a CVD process, or a PVD process. In one embodiment, the high-k film may have a thickness of about 10 Å to about 40 Å. However, the thickness of the high-k film is not limited thereto.

The gate electrode 213 may include at least one metal selected from titanium (Ti), tantalum (Ta), aluminum (Al), tungsten (W), ruthenium (Ru), niobium (Ni), molybdenum (Mo), hafnium (Hf), nickel (Ni), cobalt (Co), platinum (Pt), and palladium (Pd); a metal nitride containing at least one metal; a carbon-doped metal; or a carbon-doped metal compound, such as a carbon-doped metal nitride.

In some embodiments, the gate electrode 213 may include a plurality of films. The gate electrode 213 may include, for example, a work-function control layer and a gap-fill metal layer that fills a space above the work-function control layer. The work-function control layer may include an aluminum (Al) compound including titanium (Ti) or tantalum (Ta). For example, the work-function control layer may include titanium aluminum carbide (TiAlC), titanium aluminum nitride (TiAlN), titanium aluminum carbonitride (TiAlC—N), titanium aluminum (TiAl), tantalum aluminum carbide (TaAlC), tantalum aluminum nitride (TaAlN), tantalum aluminum carbonitride (TaAlC—N), tantalum aluminum (TaAl), or a combination thereof. The work-function controlling layer may include molybdenum (Mo), palladium (Pd), ruthenium (Ru), platinum (Pt), titanium nitride (TiN), tungsten nitride (WN), tantalum nitride (TaN), iridium (Ir), tantalum carbide (TaC), ruthenium nitride (RuN), molybdenum nitride (MoN), or combinations thereof. The gap-fill metal layer may include, for example, a metal such as tungsten (W) or aluminum (Al), a metal silicide, a metal nitride such as titanium nitride (TiN), tantalum nitride (TaN), or a combination thereof.

As another example, the gate electrode 213 may have a structure in which a metal nitride layer, a metal layer, a conductive capping layer, and a gap-fill metal layer are sequentially stacked. The conductive capping layer may include a metal nitride, such as titanium nitride (TiN) or tantalum nitride (TaN), or a combination thereof, but a material for the conductive capping layer is not limited thereto.

The gate capping layer 215 and the gate spacer 217 may each include, for example, a silicon nitride film, a silicon oxynitride film, a silicon oxynitride film containing carbon, or a composite film thereof. In some embodiments, the gate spacer 217 may further have an air gap or a low-k film therein. The height of an upper surface of the lower interlayer insulating layer 220 from the substrate 110 may be the same as the height of the upper surface of the gate structure 210 from the substrate 110. That is, the height of the upper surface of the lower interlayer insulating layer 220 from the substrate 110 may be the same as the height of an upper surface of the gate capping layer 215 from the substrate 110 and the height of an upper surface of the gate spacer 217 from the substrate 110. Accordingly, the upper surface of the lower interlayer insulating layer 220, the upper surface of the gate capping layer 215, and the upper surface of the gate spacer 217 may constitute a co-planar surface parallel to the upper surface 110U of the substrate 110.

The lower interlayer insulating layer 220 may contact side walls of the gate structure 210. When the semiconductor device 200 includes a plurality of gate structures, each being the gate structure 210, the lower interlayer insulating layer 220 may fill a space between the plurality of gate structures 210. The lower interlayer insulating layer 220 may include a silicon oxide film such as fluoro silicate glass (FSG) or TEOS, but embodiments of the present inventive concept is not limited thereto.

The resistor structure 150 may be located on a portion of the lower structure 130 on the resistor area RA. The resistor structure 150 may include the first insulating layer 151, the resistor layer 153, the second insulating layer 155, and the third insulating layer 157. Respective layers included in the resistor structure 150 are the same as described in connection with FIGS. 1 to 3C.

An upper interlayer insulating layer 230 may cover the resistor structure 150 and the lower structure 130. The upper interlayer insulating layer 230 may cover the upper surface of the gate structure 210, an upper surface of an lower interlayer insulating layer 220, and the upper surface and side walls of the resistor structure 150. The upper interlayer insulating layer 230 may be located in the transistor area TA and the resistor area RA. For example, like the lower interlayer insulating layer 220, the upper interlayer insulating layer 230 may include, for example, a film of silicon oxide, such as FSG or TEOS, but embodiments of the present inventive concept are not limited thereto.

The resistor contact 190 penetrating the upper interlayer insulating layer 230, the third insulating layer 157, the second insulating layer 155, and the resistor layer 153 may be located on the resistor area RA. In some embodiments, the resistor contact 190 may also pass through the first insulating layer 151. The tilt angle of the side wall of the resistor contact 190 with respect to the first direction D1 perpendicular to the substrate 110 may vary according to the height from the substrate 110. The detailed shape of the resistor contact 190 is the same as that described with reference to FIGS. 1 to 5D.

The source/drain contact 250 on the transistor area TA may penetrate the upper interlayer insulating layer 230 and the lower interlayer insulating layer 220 and contact the source/drain region 240. A cross-section of the source/drain contact 250 perpendicular to the first direction D1 is not limited to a circular shape and may have various other shapes. The source/drain contact 250 may include a source/drain contact core layer and a source/drain contact barrier layer surrounding the side walls and bottom of the source/drain contact core layer. The source/drain contact core layer may include a metal, a metal nitride, or an alloy. Examples of the metal are tungsten (W), copper (Cu), titanium (Ti), tantalum (Ta), ruthenium (Ru), manganese (Mn), and cobalt (Co). The metal nitride may include, for example, titanium nitride (TiN), tantalum nitride (TaN), cobalt nitride (CoN), or tungsten nitride (WN). The alloy may include cobalt tungsten phosphorus (CoWP), cobalt tungsten boron (CoWB), or cobalt tungsten boron phosphorous (CoWBP). The source/drain contact barrier layer may include, for example, titanium (Ti), tantalum (Ta), titanium nitride (TiN), or tantalum nitride (TaN).

In some embodiments, a metal silicide layer may be located between the source/drain contact 250 and the source/drain region 240. The silicide layer may include a metal silicide formed by reacting a material for the source/drain contact core layer and the source/drain region 240 or formed by reacting a separate metal material with the source/drain region 240. The silicide layer may include, for example, titanium silicide (TiSi).

Referring to FIG. 6C, in some embodiments, on the transistor area TA, a gate contact 270 may penetrate the upper interlayer insulating layer 230 and the gate capping layer 215 and contact the gate electrode 213. The gate contact 270 may include a gate contact core layer and a gate contact barrier layer surrounding the side walls and bottom of the gate contact core layer. The gate contact core layer may include a metal, a metal nitride, or an alloy. Examples of the metal are tungsten (W), copper (Cu), titanium (Ti), tantalum (Ta), ruthenium (Ru), manganese (Mn), and cobalt (Co). The metal nitride may include, for example, titanium nitride (TiN), tantalum nitride (TaN), cobalt nitride (CoN), or tungsten nitride (WN). The alloy may include cobalt tungsten phosphorus (CoWP), cobalt tungsten boron (CoWB), or cobalt tungsten boron phosphorous (CoWBP). The gate contact barrier layer may include, for example, titanium (Ti), tantalum (Ta), titanium nitride (TiN), or tantalum nitride (TaN).

Figure 7:
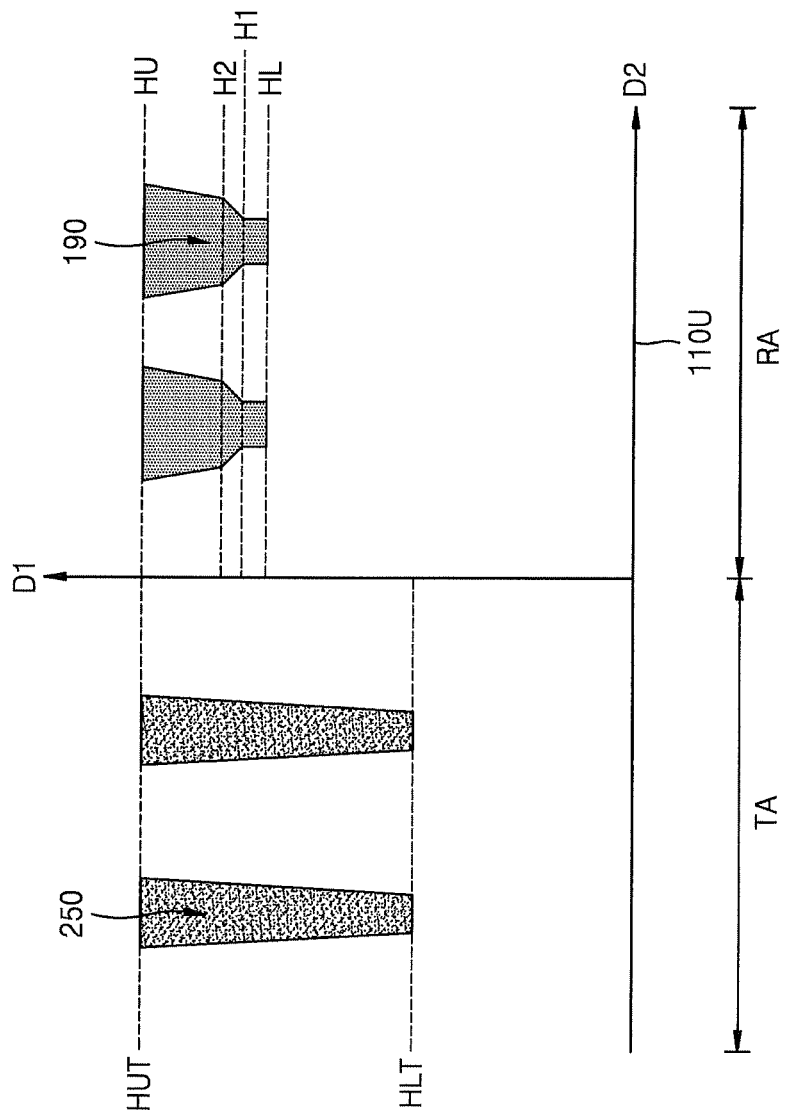
FIG. 7 is an enlarged cross-section of the resistor contact and the source/drain contact included in a semiconductor device according to some embodiments of the present inventive concept.

FIG. 7 is an enlarged cross section of the resistor contact 190 and the source/drain contact 250 included in a semiconductor device according to some embodiments of the present inventive concept.

Referring to FIG. 7, when the tilt angle of the side wall of the resistor contact 190 with respect to the first direction D1 is changed at the first height H1 from the substrate 110 and the second height H2 higher than the first height H1, the tilt angle of the side wall of the source/drain contact 250 with respect to the first direction D1 may not be changed at the first height H1 and the second height H2. In some embodiments, the tilt angle of the side wall of the source/drain contact 250 with respect to the first direction D1 may be constant regardless of the height from the substrate 110.

In some embodiments, a height HUT of the upper end of the source/drain contact 250 from the substrate 110 may be the same as the height HU of the upper surface of the resistor contact 190 from the substrate 110. A height HLT of the lower end of the source/drain contact 250 from the substrate 110 may be lower than the height HL of the lower end of the resistor contact 190 from the substrate 110.

FIGS. 8A to 8D are cross sections illustrating processing steps in the fabrication of a semiconductor device according to some embodiments of the present inventive concept. FIGS. 9A to 9C are enlarged cross sections to explain a process of etching a resistor contact hole in a fabrication process of a semiconductor device according to some embodiments of the present inventive concept.

Figure 8A:
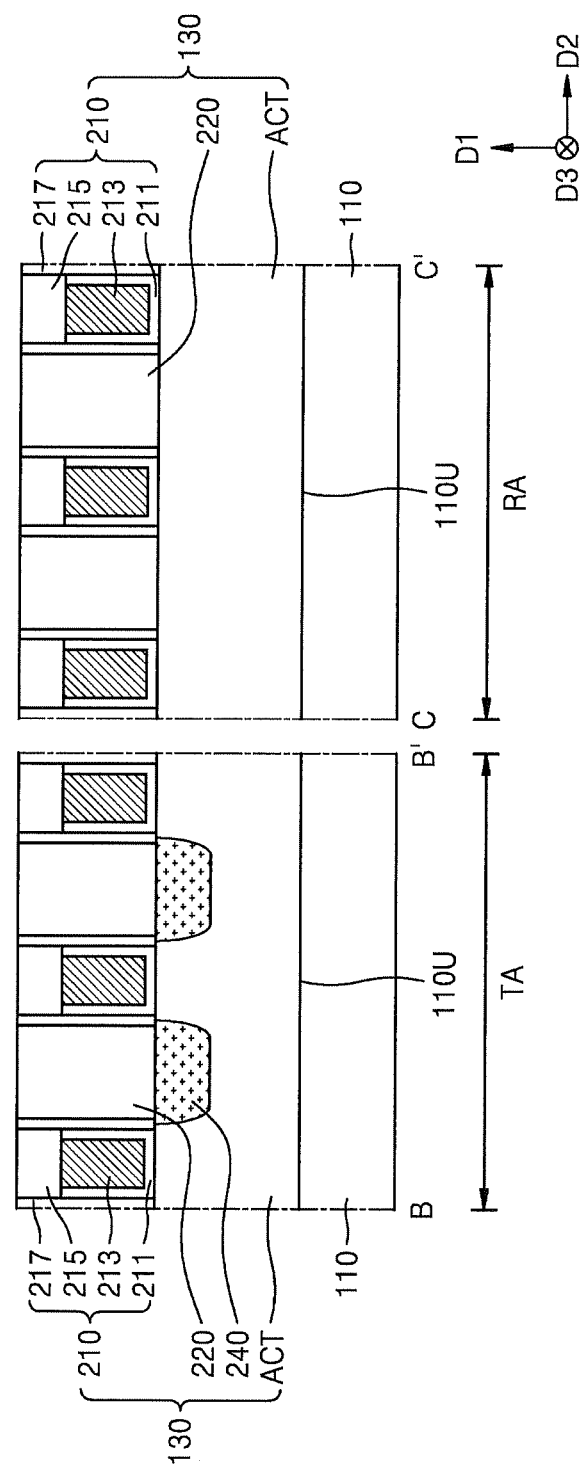
FIGS. 8A to 8D are cross-sections illustrating processing steps in the fabrication of a semiconductor device according to some embodiments of the present inventive concept.
Figure 9A:
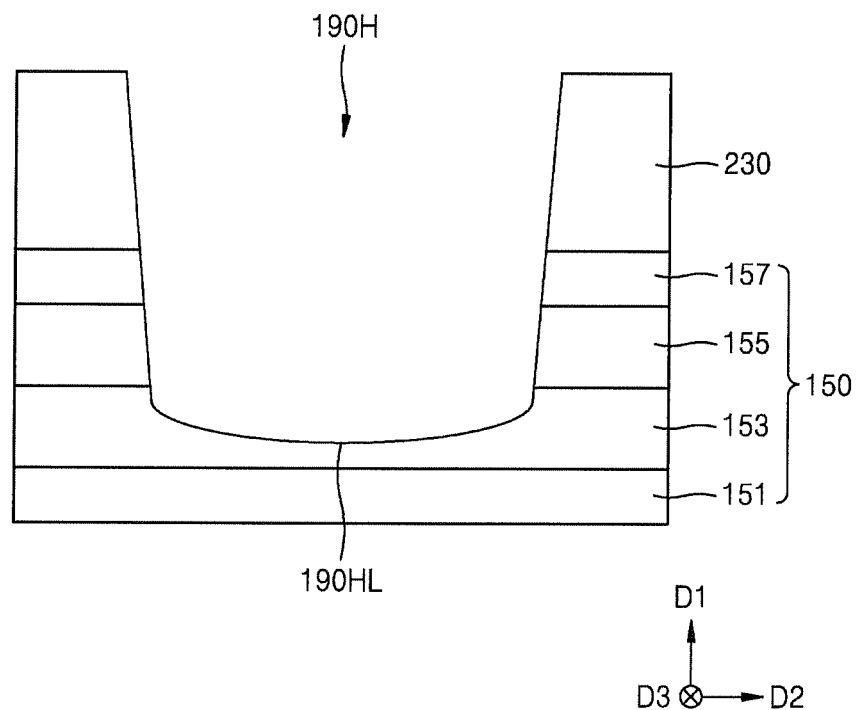
FIGS. 9A to 9C are enlarged cross-sections illustrating processing steps for etching a resistor contact hole in a fabrication process of a semiconductor device according to some embodiments of the present inventive concept.
Figure 9B:
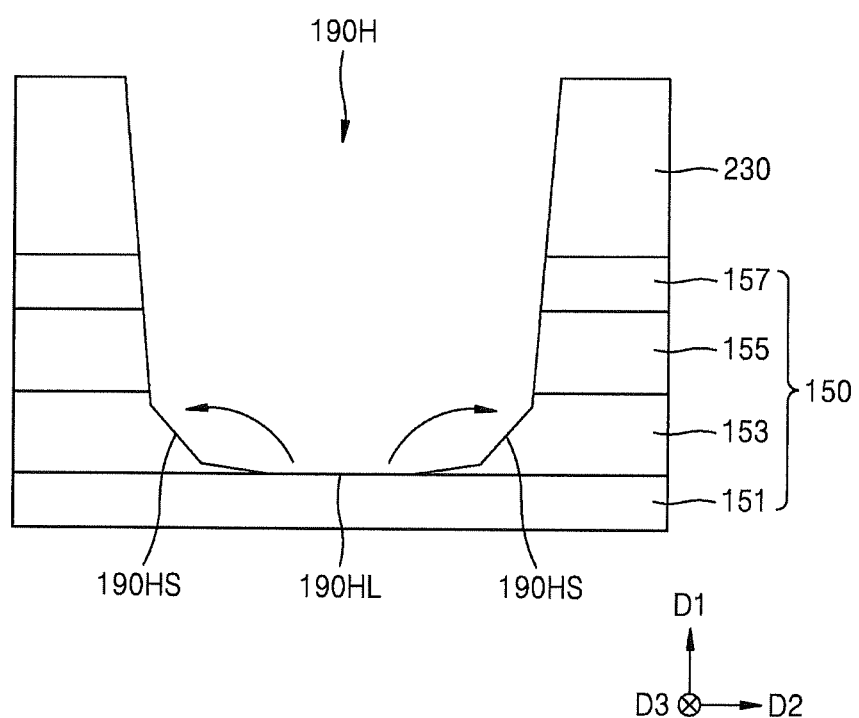
Figure 9C:
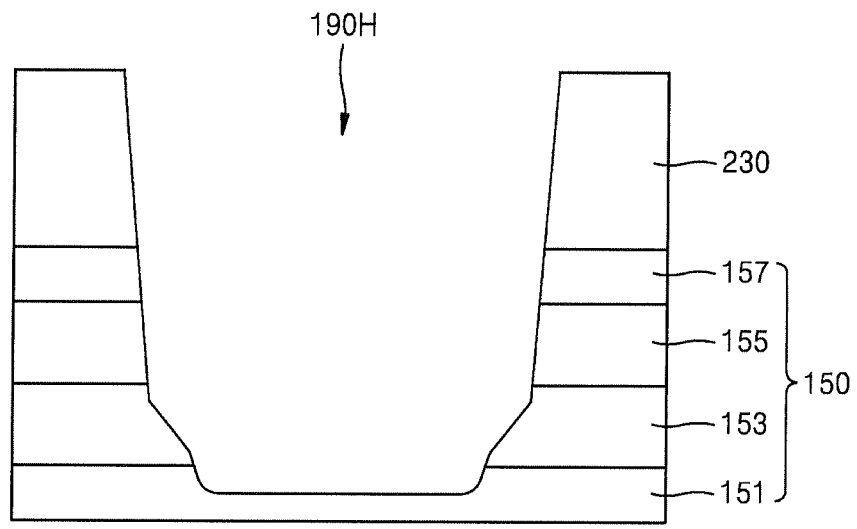
Figure 9C:
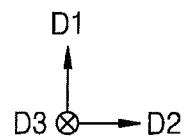

Referring to FIGS. 8A and 6C, the active region ACT is formed on the substrate 110 having the transistor area TA and the resistor area RA. The active region ACT may be pin-shaped. The active region ACT in the shape of pin may be formed by forming an epitaxial layer on the substrate 110 and patterning the same. In some embodiments, the active area ACT in the shape of pin may be formed by patterning the substrate 110 to form a trench (not shown) defining a pin-shaped active area.

A device isolation layer 290 may be formed. First, the trench is filled with an insulating material and then planarized. Next, a portion of the insulating material filling the trench is removed to expose the top of the trench. Accordingly, the upper portion of the active region ACT may protrude from the device isolation layer 290.

Next, the gate structure 210 is formed on the substrate 110. In some embodiments, the gate structure 210 may be formed by a replacement gate method. For example, a sacrificial gate pattern (not shown) is formed, and then, the gate spacer 217 is formed on the side walls of the sacrificial gate pattern. Next, the lower interlayer insulating layer 220 covering the side wall of the gate spacer 217 is formed. Thereafter, the sacrificial gate pattern may be removed. Next, the resultant space generated due to the removal of the sacrificial gate pattern is filled with the gate dielectric layer 211, the gate electrode 213, and the gate capping layer 215, thereby forming the gate structure 210.

The source/drain regions 240 may be formed under the side walls of the gate structure 210 on the substrate 110. In some embodiments, after the sacrificial gate pattern is formed and before the gate structure 210 is formed, the source/drain regions 240 may be formed. For example, a portion of the substrate 110 below the side walls of the sacrificial gate pattern is removed to form a recessed region, and an epitaxial layer containing impurities is grown in the recessed region to form the source/drain region 240. Alternatively, impurities may be implanted into the substrate 110 to form the source/drain regions 240. After the source/drain region 240 is formed, the lower interlayer insulating layer 220 and the gate structure 210 may be formed.

Next, the lower interlayer insulating layer 220 covering the side walls of the gate structure 210 may be formed. The lower interlayer insulating layer 220 may be deposited by, for example, chemical vapor deposition (CVD) or plasma enhanced CVD (PECVD).

Figure 8B:
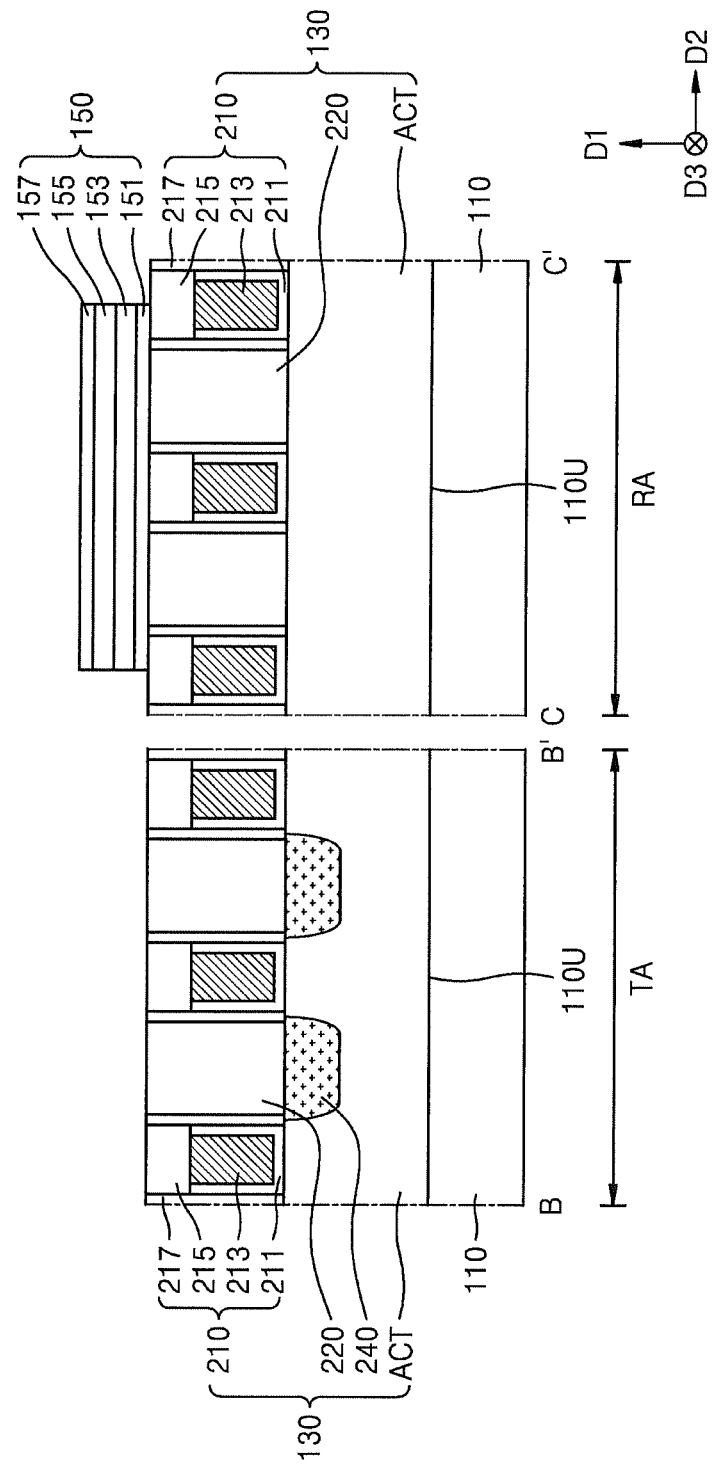

Referring to FIG. 8B, the resistor structure 150 is formed. The resistor structure 150 may be formed by sequentially depositing the first insulating layer 151, the resistor layer 153, the second insulating layer 155, and the third insulating layer 157 and then patterning them. The first insulating layer 151 and the third insulating layer 157 may be deposited by atomic layer deposition (ALD), for example. The second insulating layer 155 and the resistor layer 153 may be deposited by, for example, PVD, CVD, or ALD. The patterning may be performed using a lithographic process.

Figure 8C:
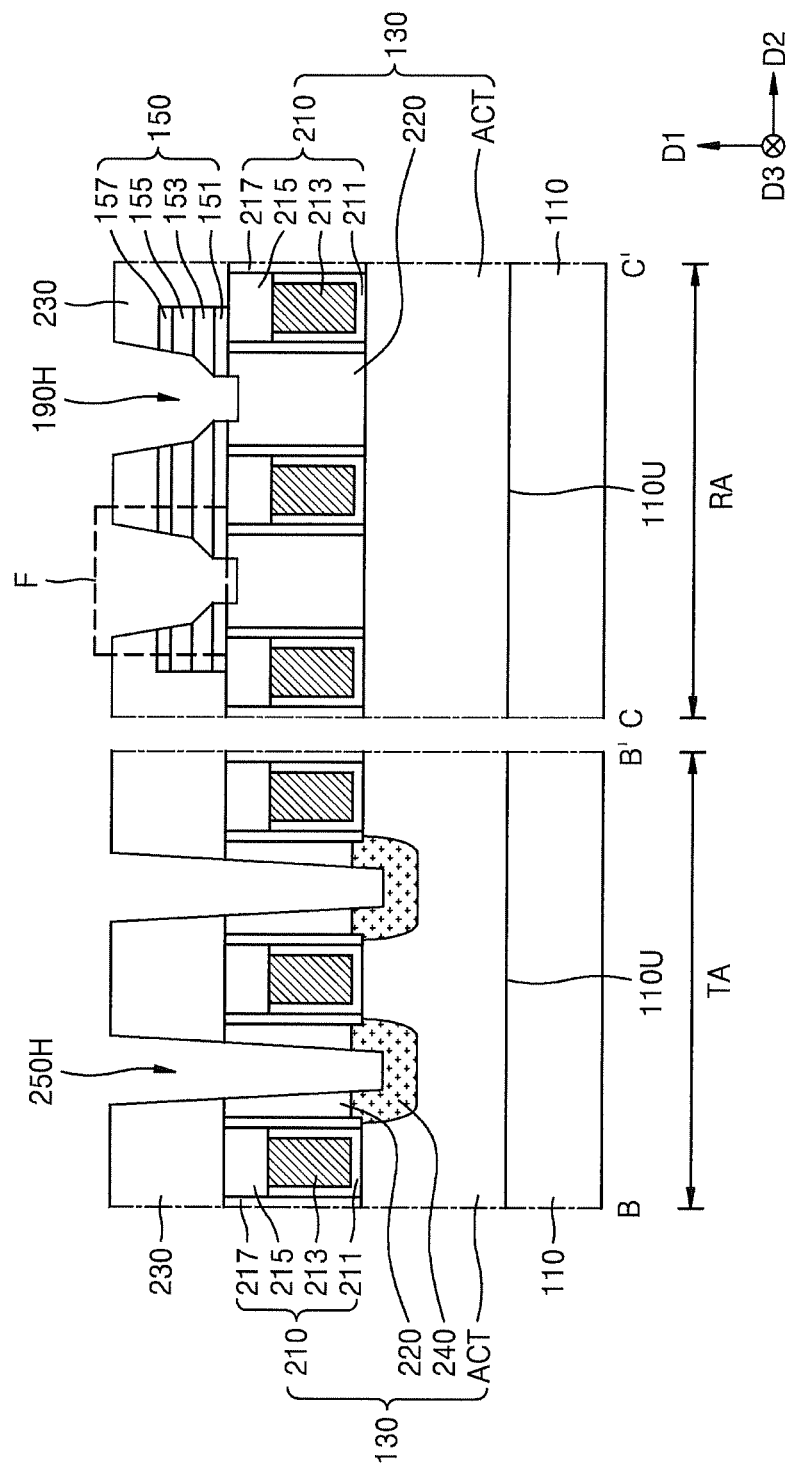

Referring to FIG. 8C, formed is the upper interlayer insulating layer 230 which covers the upper surface and side walls of the resistor structure 150, the upper surface of the gate structure 210, and the upper surface of the lower interlayer insulating layer 220. The upper interlayer insulating layer 230 may be deposited by, for example, CVD or PECVD.

After forming the upper interlayer insulating layer 230, a resistor contact hole 190H, a source/drain contact hole 250H, and a gate contact hole (not shown) are formed. Referring to FIG. 9A, after a photoresist mask (not shown) is formed on the upper interlayer insulating layer 230, a first etching process is performed on the resultant structure to pattern the upper interlayer insulating layer 230, the third insulating layer 157, and the second insulating layer 155, thereby forming the resistor contact hole 190H. The first etching process may be a dry etching process. The first etching process may be a process in which the etch selectivity of the second insulating layer 155 with respect to the resistor layer 153 is low. Accordingly, a part of the upper surface of the resistor layer 153 may be etched by the first etching process. That is, a lower portion 190HL of the resistor contact hole 190H may expose the resistor layer 153. In some embodiments, unlike the embodiments discussed above with respect to FIG. 9A, the resistor contact hole 190H formed by the first etching process may not pass through the second insulating layer 155. That is, the lower portion 190HL of the resistor contact hole may expose the second insulating layer 155.

Referring to FIG. 9B, a second etching process is performed in which the resistor layer 153 is etched by using, as a mask, the second insulating layer 155 which is formed by the patterning. The second etching process may be a dry etching process. The second etching process may be performed by using an etching material having a low chemical reactivity with a material that constitutes the resistor layer 153. That is, in the second etching process, the resistor layer 153 may be etched by physical collision with etching materials. For example, when the resistor layer 153 is titanium nitride (TiN), fluoroform ($CHF_3$) may be used as an etch gas. In the second etching process, due to the collision, particles constituting the resistor layer 153 are separated from the lower portion 190HL of the resistor contact hole 190H, and then deposited on a side wall 190HS of the resistor contact hole 190H. Due to the side wall re-deposition phenomenon, an angle formed by the side wall 190HS of the resistor contact hole 190H and the first direction D1 being perpendicular to the substrate 110 is changed where the resistor contact hole 190H contacts the resistor layer 153.

Referring to FIG. 9C, the second etching process further proceeds so that the lower portion 190HL of the resistor contact hole 190H exposes the first insulating layer 151. The first insulating layer 151 is etched by using the patterned resistor layer 153 as an etch mask. From among particles separated from the lower portion 190HL of the resistor contact hole 190H, the amount of particles that are re-deposited on the side wall of the resistor contact hole 190H may be small. This may be due to the fact that a chemical reactivity between a material constituting the first insulating layer 151 and an etching material is different from a chemical reactivity between the material constituting the resistor layer 153 and an etching material. Accordingly, the angle formed by the side wall 190HS of the resistor contact hole 190H and the first direction D1 perpendicular to the substrate 110 may be changed where the resistor contact hole 190H contacts the first insulating layer 151. The second etching process may be performed until the lower portion 190HL of the resistor contact hole 190H exposes the first insulating layer 151. In some embodiments, as illustrated in FIG. 8C, the second etching process may be finished when the resistor contact hole 190H penetrates the first insulating layer 151 to expose the lower interlayer insulating layer 220.

According to the etched depth of the resistor contact hole 190H when the first etching process is finished, the amount of material re-deposited at the side wall 190HS of the resistor contact hole 190H during the second etching process, and the etched depth of the resistor contact hole 190H when the second etching process is finished, as described in connection with FIGS. 5A through 5D, the first height 111 and the second height H2 at which the tilt angle of the side wall of the resistor contact 190 are changed may each vary.

The source/drain contact holes 250H and the gate contact holes (not shown) may be formed in a separate process from the resistor contact holes 190H, or may be formed together through the same process. Even when the source/drain contact hole 250H and the resistor contact hole 190H are formed in the same process, the tilt angle of the side wall of the source/drain contact hole 250H with respect to the first direction D1 may be constant regardless of the height from the substrate 110. This is because, during the second etching process, in source/drain contact holes 250H, the side wall re-deposition does not occur or even when the side wall re-deposition does occur, the amount of material re-deposited at the side wall may be constant regardless of the height from the substrate 110. That is, since a material or structure to be etched to form the source/drain contact hole 250H is different from a material or structure to be etched to form the resistor contact hole 190H, the shape of the source/drain contact hole 250H is different from the shape of the resistor contact hole 190H. In some embodiments, the tilt angle of the side wall of the source/drain contact hole 250H with respect to the first direction D1 may vary according to the height from the substrate 110, but at the first height H1 (see FIG. 7) and the second height H2 (see FIG. 7) at which the tilt angle of the side wall of the resistor contact 190 is changed, the tilt angle of the side wall of the source/drain contact hole 250H with respect to the first direction D1 may not be changed.

The source/drain contact hole 250H may extend through the upper interlayer insulating layer 230 and the lower interlayer insulating layer 220 to expose the source/drain region 240. In some embodiments, a gate contact hole may be formed through the upper interlayer insulating layer 230 and the gate capping layer 215 to expose the gate electrode 213.

Figure 8D:
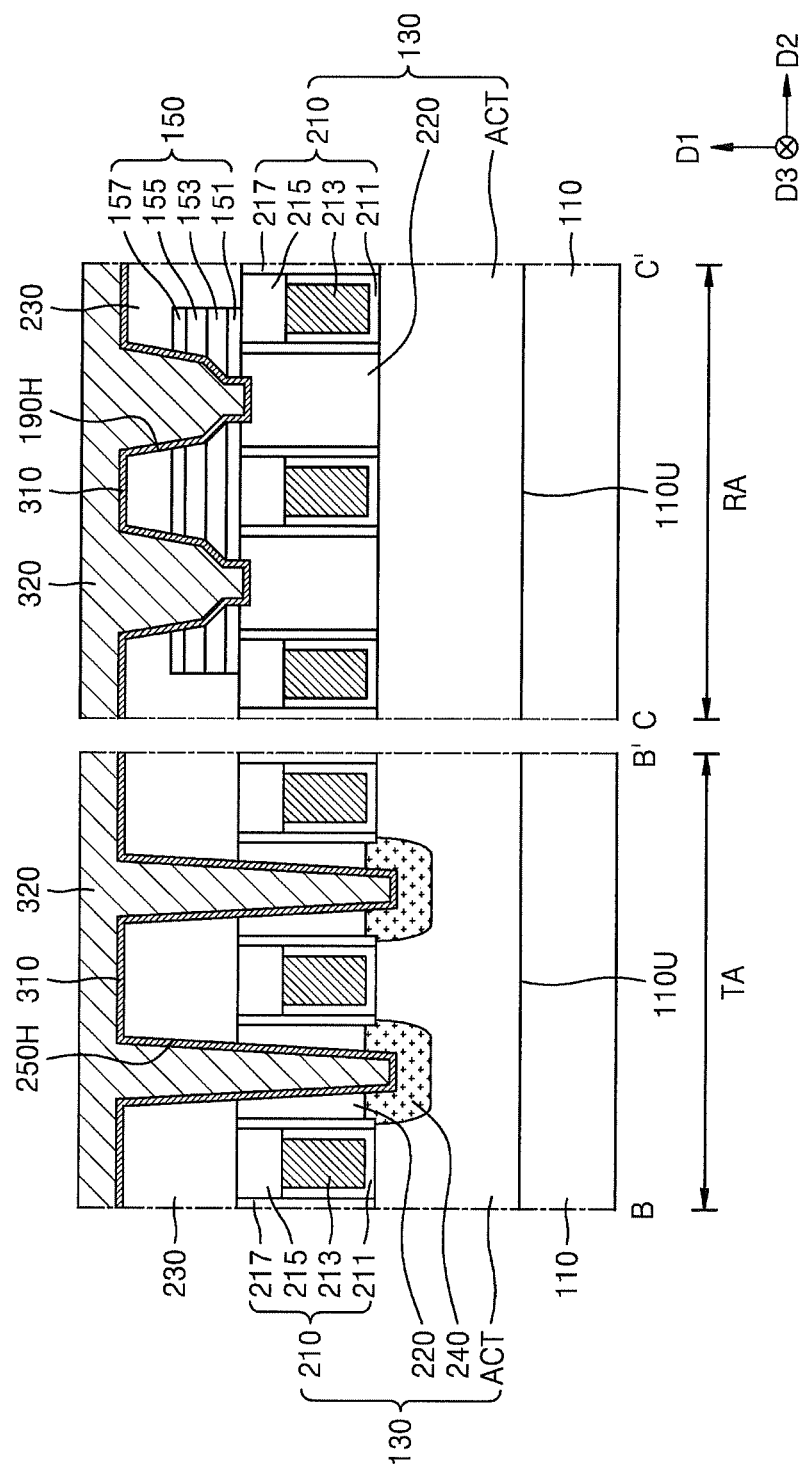

Referring to FIG. 8D, formed is a barrier layer 310 conformally covering the resistor contact hole 190H, the source/drain contact hole 250H, and the upper surface of the upper interlayer insulating layer 230. A core layer 320 covering the barrier layer 310 and filling the source/drain contact hole 250H and the resistor contact hole 190H is formed. Thereafter, so that the upper interlayer insulating layer 230 is exposed, a portion of the core layer 320 and a portion of the barrier layer 310 may be removed to form the source/drain contact 250 and the resistor contact 190. In some embodiments for forming a gate contact hole, the barrier layer 310 and the core layer 320 are formed even on a gate contact hole, and then, a portion of the barrier layer 310 and a portion of the barrier layer 310 may be removed so that the upper interlayer insulating layer 230 is exposed, thereby forming the gate contact 270.

Figure 10:
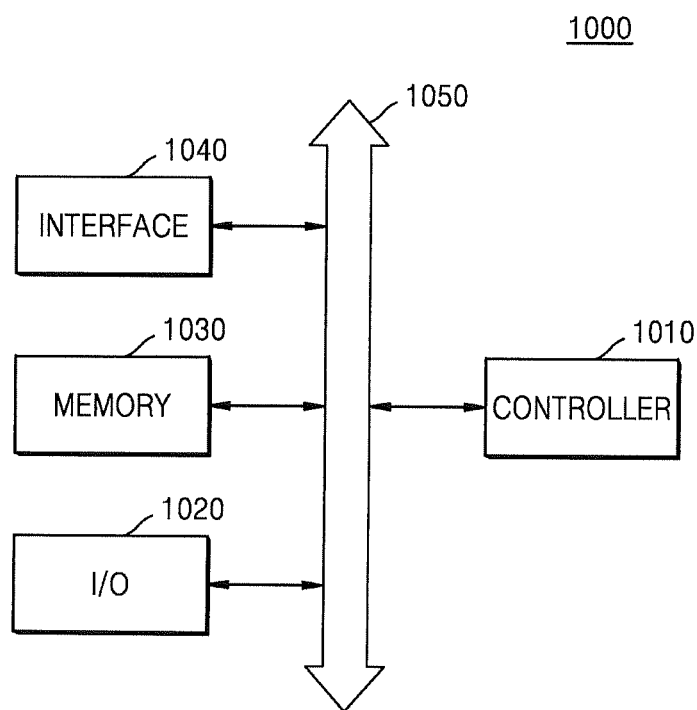
FIG. 10 is a block diagram of an electronic system according to some embodiments of the present inventive concept.

FIG. 10 is a block diagram of an electronic system 1000 according to some embodiments of the present inventive concept.

Referring to FIG. 10, the electronic system 1000 includes a controller 1010, an input/output device 1020, a memory 1030, and an interface 1040, which are interconnected to one another through a bus 1050.

The controller 1010 may include at least one of a microprocessor, a digital signal processor, or a processing device similar to these. The input/output device 1020 may include at least one of a keypad, a keyboard, and a display. The memory 1030 may be used to store instructions executed by the controller 1010. For example, the memory 1030 may be used to store user data.

The electronic system 1000 may constitute a wireless communication device, or a device capable of transmitting and/or receiving information under a wireless environment. In the electronic system 1000, the interface 1040 may be configured as a wireless interface for transmitting/receiving data through the wireless communication network. The interface 1040 may include an antenna and/or a wireless transceiver. In some embodiments, the electronic system 1000 may be used in a communication interface protocol of a third-generation communication system. Examples of the third-generation communication system include code division multiple access (CDMA), global system for mobile communications (GSM), north american digital cellular (NADC), extended-time division multiple access (E-TDMA), and/or wide band code division multiple access (WCDMA). The electronic system 1000 includes at least one of the semiconductor devices described in connection with FIGS. 1 to 9C, and semiconductor devices which are manufactured by using various methods obtained by changing the method according to some embodiments of the present inventive concept within the scope of the present inventive concept.

While the inventive concept have been discussed with reference to example embodiments, it will be apparent to those skilled in the art that various changes and modifications may be made without departing from the spirits and scopes of the inventive concept. Therefore, it should be understood that the above embodiments are not limiting, but illustrative. Thus, the scopes of the inventive concept are to be determined by the broadest permissible interpretation of the following claims and their equivalents, and shall not be restricted or limited by the foregoing description.

What is claimed is:

1. A semiconductor device comprising:
a substrate having an upper surface perpendicular to a first direction;
a resistor structure including a first insulating layer on the substrate, a resistor layer on the first insulating layer, and a second insulating layer on the resistor layer; and
a resistor contact penetrating the second insulating layer and the resistor layer,
wherein a tilt angle of a side wall of the resistor contact with respect to the first direction varies according to a height from the substrate,
wherein a width of an upper end of the resistor contact is larger than a width of a lower end of the resistor contact, and
wherein the resistor contact directly contacts the first insulating layer.

2. The semiconductor device of claim 1, wherein the tilt angle of the side wall of the resistor contact with respect to the first direction changes at a first height from the substrate and a second height, greater than the first height.

3. The semiconductor device of claim 2, wherein the first height is less than a height of an upper surface of the resistor layer from the substrate.

4. The semiconductor device of claim 2, wherein the second height is greater than a height of a lower surface of the resistor layer from the substrate.

5. The semiconductor device of claim 1:
wherein the resistor contact comprises a first region having a side wall that has a first tilt angle with respect to the first direction, a second region located on the first region and having a side wall that has a second tilt angle with respect to the first direction, and a third region located on the second region and having a side wall that has a third tilt angle with respect to the first direction; and
wherein the first tilt angle is less than the second tilt angle, and the second tilt angle is greater than the third tilt angle.

6. The semiconductor device of claim 5:
wherein a length of the first region in the first direction is less than a length of the third region in the first direction; and wherein a length of the second region in the first direction is less than the length of the third region in the first direction.

7. The semiconductor device of claim 5:
wherein the side wall of the first region directly contacts the first insulating layer;
wherein the side wall of the second region directly contacts the resistor layer; and
wherein the side wall of the third region directly contacts the second insulating layer.

8. The semiconductor device of claim 5, wherein a maximum width of the first region in a second direction perpendicular to the first direction is less than a maximum width of the third region in the second direction.

9. The semiconductor device of claim 5, wherein a difference between a maximum width of the first region in a second direction and a minimum width of the first region in the second direction is less than a difference between a maximum width of the second region in the second direction and a minimum width of the second region in the second direction.

10. The semiconductor device of claim 5, wherein a difference between a maximum width of the second region in a second direction and a minimum width of the second region in the second direction is greater than a difference between a maximum width of the third region in the second direction and a minimum width of the third region in the second direction.

11. The semiconductor device of claim 1, further comprising a lower structure between the substrate and the first insulating layer, wherein the resistor contact penetrates the first insulating layer.

12. A semiconductor device comprising:
a substrate having an upper surface perpendicular to a first direction and having a transistor area and a resistor area;
a lower structure on the resistor area and the transistor area;
a resistor structure on a portion of the lower structure on the resistor area and comprising a first insulating layer, a resistor layer on the first insulating layer, and a second insulating layer on the resistor layer; and
a resistor contact penetrating the second insulating layer and the resistor layer,
wherein a tilt angle of a side wall of the resistor contact with respect to the first direction varies according to a height from the substrate,
wherein a width of an upper end of the resistor contact is larger than a width of a lower end of the resistor contact, and
wherein the resistor contact directly contacts the first insulating layer.

13. The semiconductor device of claim 12, wherein a portion of the lower structure on the resistor area comprises a gate structure and a lower interlayer insulating layer that contacts a side wall of the gate structure.

14. The semiconductor device of claim 12, wherein a portion of the lower structure on the transistor area comprises a transistor structure comprising a gate structure, an active region below the gate structure, and a source/drain region contacting the active region.

15. The semiconductor device of claim 12, wherein the lower structure comprises a plurality of gate structures and a lower interlayer insulating layer filling spaces in between the plurality of gate structures.

16. A semiconductor device comprising:

a substrate having an upper surface perpendicular to a first direction and having a transistor area and a resistor area;

a lower structure on the transistor area and the resistor area, and comprising a plurality of gate structures, a lower interlayer insulating layer filling spaces between the plurality of gate structures, an active region below the gate structures on the transistor area, and a source/drain region contacting the active region;

a resistor structure formed on a top surface of the lower structure on the resistor area and comprising a first insulating layer, a resistor layer on the first insulating layer, and a second insulating layer on the resistor layer;

an upper interlayer insulating layer covering the resistor structure and the lower structure;

a resistor contact penetrating the upper interlayer insulating layer, the second insulating layer, and the resistor layer; and a source/drain contact contacting the source/drain region through the upper interlayer insulating layer and the lower interlayer insulating layer, wherein a tilt angle of a side wall of the resistor contact with respect to the first direction varies according to a height from the substrate.

17. The semiconductor device of claim 16:

wherein the tilt angle of the side wall of the resistor contact with respect to the first direction is changed at a first height from the substrate and a second height being greater than the first height; and wherein a tilt angle of a side wall of the source/drain contact with respect to the first direction is not changed at the first height and the second height being greater than the first height.

18. The semiconductor device of claim 16, wherein a tilt angle of a side wall of the source/drain contact with respect to the first direction is constant regardless of a height from the substrate.

19. The semiconductor device of claim 16, wherein a height of an upper end of the source/drain contact from the substrate is similar to a height of an upper end of the resistor contact from the substrate.

20. The semiconductor device of claim 16, wherein a height of a lower end of the source/drain contact from the substrate is less than a height of a lower end of the resistor contact from the substrate.

* * * * *